(12) United States Patent
Baba et al.

(10) Patent No.: US 12,439,675 B2
(45) Date of Patent: Oct. 7, 2025

(54) SEMICONDUCTOR DEVICE AND METHOD FOR MANUFACTURING THE SAME

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Shotaro Baba, Kanazawa (JP); Hiro Gangi, Ota (JP); Hiroaki Katou, Nonoichi (JP); Saya Shimomura, Komatsu (JP); Shingo Sato, Kanazawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 669 days.

(21) Appl. No.: 17/809,777

(22) Filed: Jun. 29, 2022

(65) Prior Publication Data

US 2023/0197810 A1 Jun. 22, 2023

(30) Foreign Application Priority Data

Dec. 17, 2021 (JP) .................................. 2021-204761

(51) Int. Cl.
*H10D 64/27* (2025.01)
*H01L 21/28* (2025.01)
(Continued)

(52) U.S. Cl.
CPC ........... *H10D 64/513* (2025.01); *H01L 21/28* (2013.01); *H01L 23/522* (2013.01); *H10D 30/66* (2025.01); *H10D 64/517* (2025.01)

(58) Field of Classification Search
CPC ...... H10D 64/513; H10D 30/66; H10D 64/51; H10D 30/668; H10D 30/0297;
(Continued)

(56) References Cited

U.S. PATENT DOCUMENTS

| 8,816,419 B2 | 8/2014 | Takaishi |
|---|---|---|
| 2011/0291186 A1* | 12/2011 | Yilmaz ................ H10D 30/668 257/334 |

(Continued)

FOREIGN PATENT DOCUMENTS

| JP | 60-109260 A | 6/1985 |
|---|---|---|
| JP | 2009-4411 A | 1/2009 |

(Continued)

OTHER PUBLICATIONS

Kobayashi, K. et al., "Drift Layer Design Utilizing Intermediate Boron Ion-implantation for 100-V-Class Two-Step-Oxide Field-Plate Trench MOSFET to Improve Switching Loss", 33rd International Symposium on Power Semiconductor Devices and ICs (ISPSD), 2021, pp. 191-194.

(Continued)

*Primary Examiner* — Steven B Gauthier
*Assistant Examiner* — Khatib A Rahman
(74) *Attorney, Agent, or Firm* — Oblon, McClelland, Maier &Neustadt, L.L.P.

(57) ABSTRACT

According to one embodiment, a semiconductor device includes first to third electrodes, a semiconductor member, a first conductive member, a connecting member, a first member, and an insulating member. The semiconductor member includes first to third semiconductor regions. The first semiconductor region is between the first electrode and the third semiconductor region. The first semiconductor region includes first to third partial regions. The second semiconductor region is between the first and third semi- (Continued)

conductor regions. The second semiconductor region includes third and fourth semiconductor portions. The third semiconductor region includes first and second semiconductor portions. The second electrode is electrically connected with the third semiconductor region. The third electrode includes a first electrode portion. The first conductive member includes first to third conductive regions. The connecting member is electrically connected with the first conductive member. The first member is provided between the first electrode portion and the connecting member.

17 Claims, 31 Drawing Sheets

(51) Int. Cl.
*H01L 23/522* (2006.01)
*H10D 30/66* (2025.01)

(58) Field of Classification Search
CPC .. H10D 62/127; H10D 64/112; H10D 64/117; H10D 64/256; H10D 64/518; H10D 12/038; H10D 30/025; H10D 12/481; H10D 30/63; H01L 21/28; H01L 23/522
See application file for complete search history.

(56) References Cited

U.S. PATENT DOCUMENTS

| | | | | |
|---|---|---|---|---|
| 2012/0061722 A1* | 3/2012 | Hashimoto | .......... | H10D 30/668 257/E27.06 |
| 2013/0069150 A1* | 3/2013 | Matsuoka | ............ | H10D 62/393 438/270 |
| 2013/0153995 A1 | 6/2013 | Misawa et al. | | |
| 2014/0209999 A1* | 7/2014 | Sato | ..................... | H10D 64/117 438/270 |
| 2015/0048445 A1 | 2/2015 | Noebauer et al. | | |
| 2015/0179764 A1* | 6/2015 | Okumura | ............... | H10D 48/30 438/270 |
| 2016/0079375 A1* | 3/2016 | Yamazaki | ........... | H10D 12/038 257/330 |
| 2017/0062586 A1 | 3/2017 | Mao et al. | | |
| 2017/0263768 A1* | 9/2017 | Katoh | ................... | H10D 62/393 |
| 2019/0081030 A1* | 3/2019 | Katou | ............... | H01L 21/26513 |
| 2019/0081173 A1* | 3/2019 | Nishiwaki | ............ | H10D 62/105 |
| 2019/0123197 A1* | 4/2019 | Katoh | ............... | H10D 30/0297 |
| 2020/0266293 A1* | 8/2020 | Katou | ................... | H10D 62/106 |
| 2021/0202736 A1 | 7/2021 | Nishiguchi | | |

FOREIGN PATENT DOCUMENTS

| | | | |
|---|---|---|---|
| JP | 2013-125827 | A | 6/2013 |
| JP | 5674530 | B2 | 2/2015 |
| JP | 2016-072532 | A | 5/2016 |
| JP | 2018-022858 | A | 2/2018 |
| JP | 6310577 | B2 | 4/2018 |
| JP | 2019-54071 | A | 4/2019 |
| JP | 2021-106179 | A | 7/2021 |
| JP | 2021-145122 | A | 9/2021 |

OTHER PUBLICATIONS

Nishiwaki, T. et al., "Gate drive Techniques of Gate-Connected Trench Field Plate Power MOSFETs to Reduce Both Switching and Conduction Losses", 33rd International Symposium on Power Semiconductor Devices and ICs (ISPSD), 2021, pp. 155-158.
Japanese Office Action issued Feb. 18, 2025 in Japanese Patent Application No. 2021-204761 (with unedited computer-generated English Translation), 10 pages.

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2021-204761, filed on Dec. 17, 2021; the entire contents of which are incorporated herein by reference.

FIELD

Embodiments described herein relate generally to a semiconductor device and a method for manufacturing the same.

BACKGROUND

For example, in a semiconductor device such as a transistor, reduction of loss is desired.

DETAILED DESCRIPTION

Figure 1:
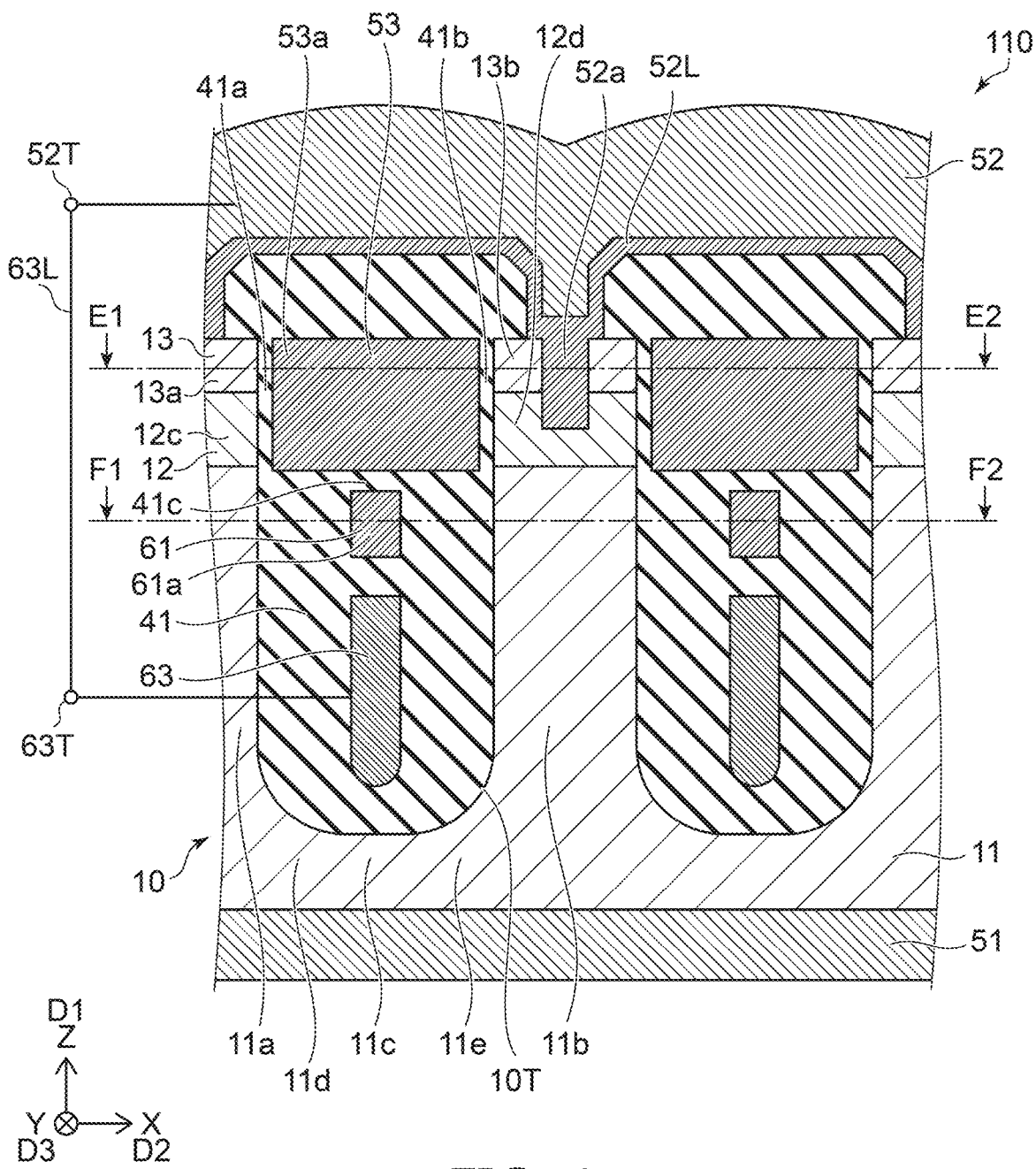
FIG. 1 is a schematic cross-sectional view illustrating a semiconductor device according to a first embodiment.

According to one embodiment, a semiconductor device includes a first electrode, a second electrode, a third electrode, a semiconductor member, a first conductive member, a connecting member, a first member, and an insulating member. The semiconductor member includes a first semiconductor region of a first conductivity type, a second semiconductor region of a second conductivity type, and a third semiconductor region of the first conductivity type. The first semiconductor region is between the first electrode and the third semiconductor region. The first semiconductor region includes a first partial region, a second partial region, and a third partial region. The second semiconductor region is between the first semiconductor region and the third semiconductor region. The third semiconductor region includes a first semiconductor portion and a second semiconductor portion. A second direction from the first semiconductor portion to the second semiconductor portion crosses a first direction from the first electrode to the third semiconductor region. The second semiconductor region includes a third semiconductor portion and a fourth semiconductor portion. A direction from the third semiconductor portion to the fourth semiconductor portion is along the second direction. The third semiconductor portion is between the first partial region and the first semiconductor portion in the first direction. The fourth semiconductor portion is between the second partial region and the second semiconductor portion in the first direction. A position of the third partial region in the second direction is between a position of the first partial region in the second direction and a position of the second partial region in the second direction. The second electrode is electrically connected with the third semiconductor region. The third electrode includes a first electrode portion. The first electrode portion is between the first semiconductor portion and the second semiconductor portion, and between the third semiconductor portion and the fourth semiconductor portion in the second direction. The first conductive member includes a first conductive region, a second conductive region, and a third conductive region. The first conductive region is between the first partial region and the second partial region in the second direction. A position of the first conductive region in the first direction is between a position of the third partial region in the first direction and a position of the first electrode portion in the first direction. The second conductive region is between the first conductive region and the third conductive region in a third direction crossing a plane including the first direction and the second direction. The connecting member is electrically connected with the first conductive member. A direction from the third conductive region to the connecting member is along the first direction. The first member is provided between the first electrode portion and the connecting member in the third direction. A position of the second conductive region in the first direction is between a position of the third partial region in the first direction and a position of the first member in the first direction. The first member includes an element different from an element included in the second conductive region. The insulating member is provided between the semiconductor member and the third electrode, between the semiconductor member and the first conductive member, and between the first conductive member and the first member.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIGS. 1 to 5 are schematic cross-sectional views illustrating a semiconductor device according to a first embodiment.

Figure 2:
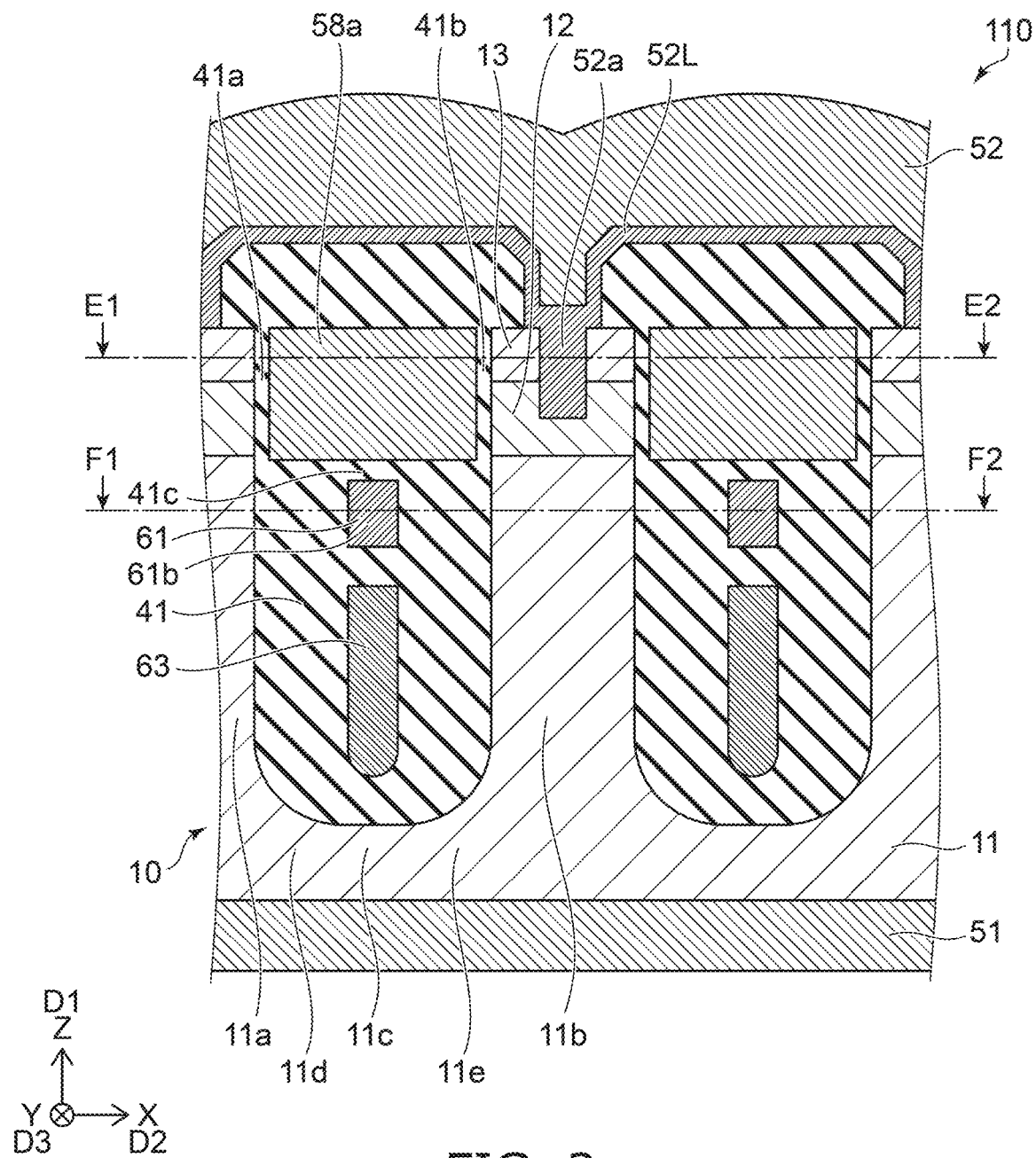
FIG. 2 is a schematic cross-sectional view illustrating the semiconductor device according to the first embodiment.
Figure 3:
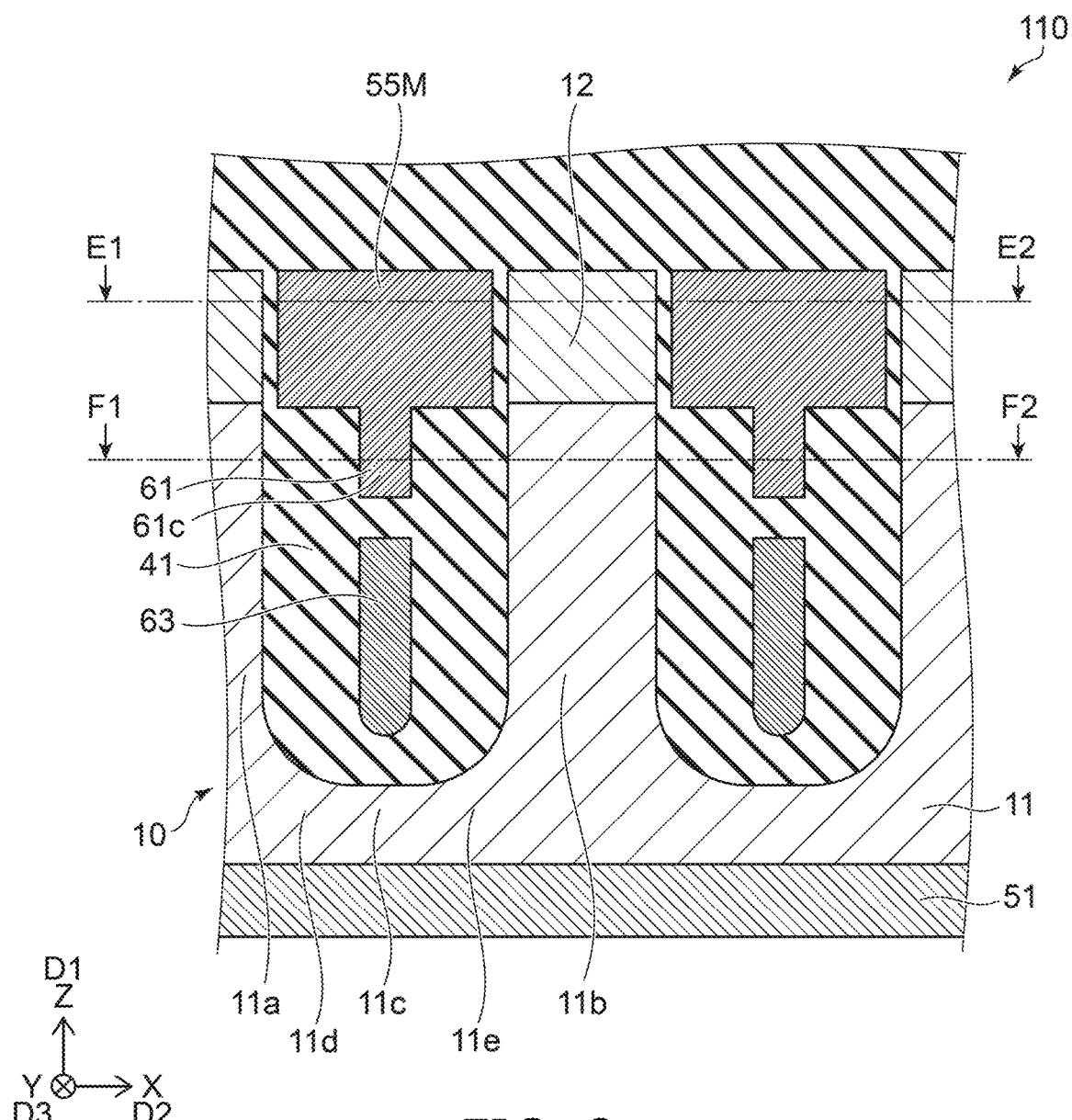
FIG. 3 is a schematic cross-sectional view illustrating the semiconductor device according to the first embodiment.
Figure 4:
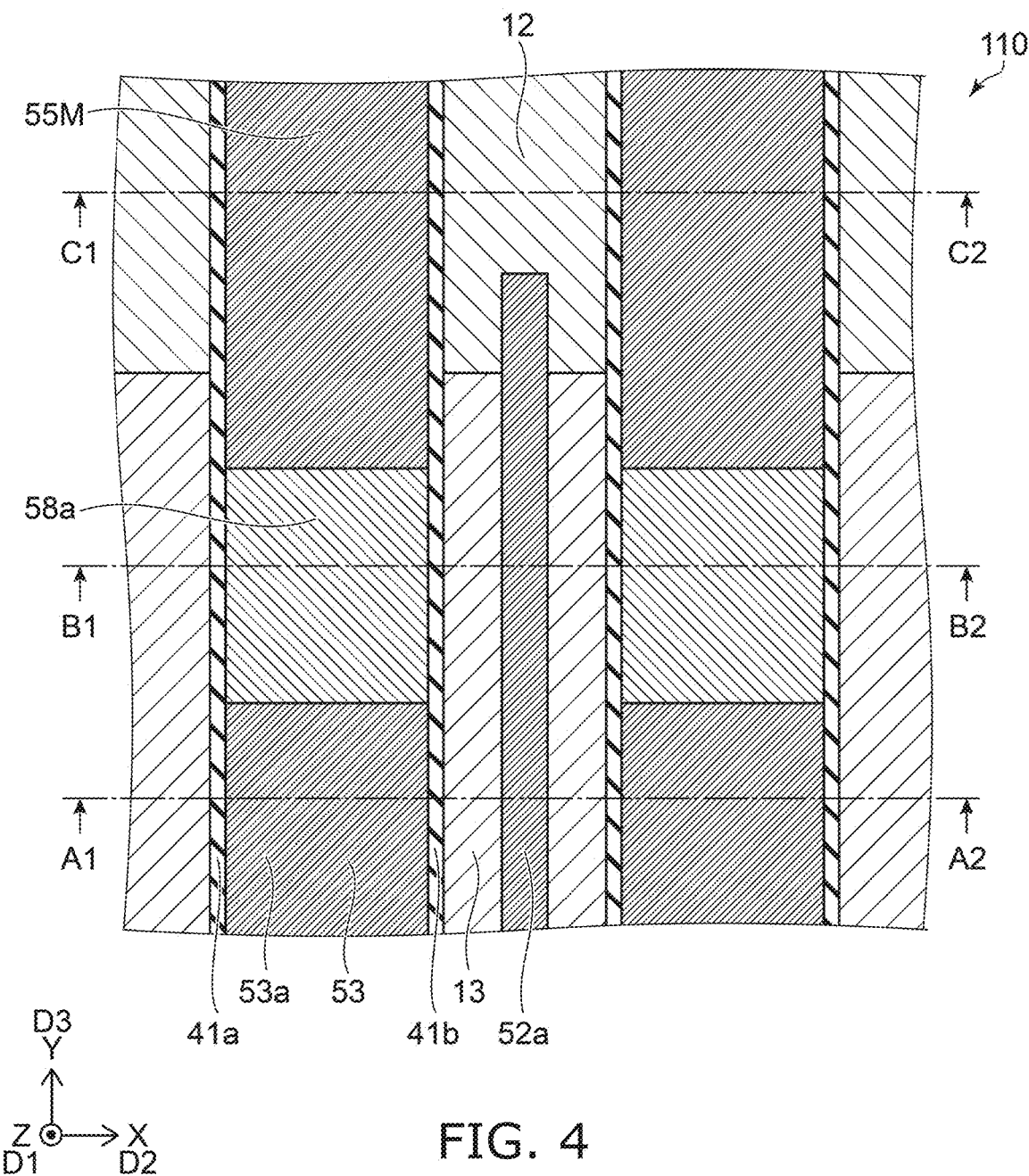
FIG. 4 is a schematic cross-sectional view illustrating the semiconductor device according to the first embodiment.
Figure 5:
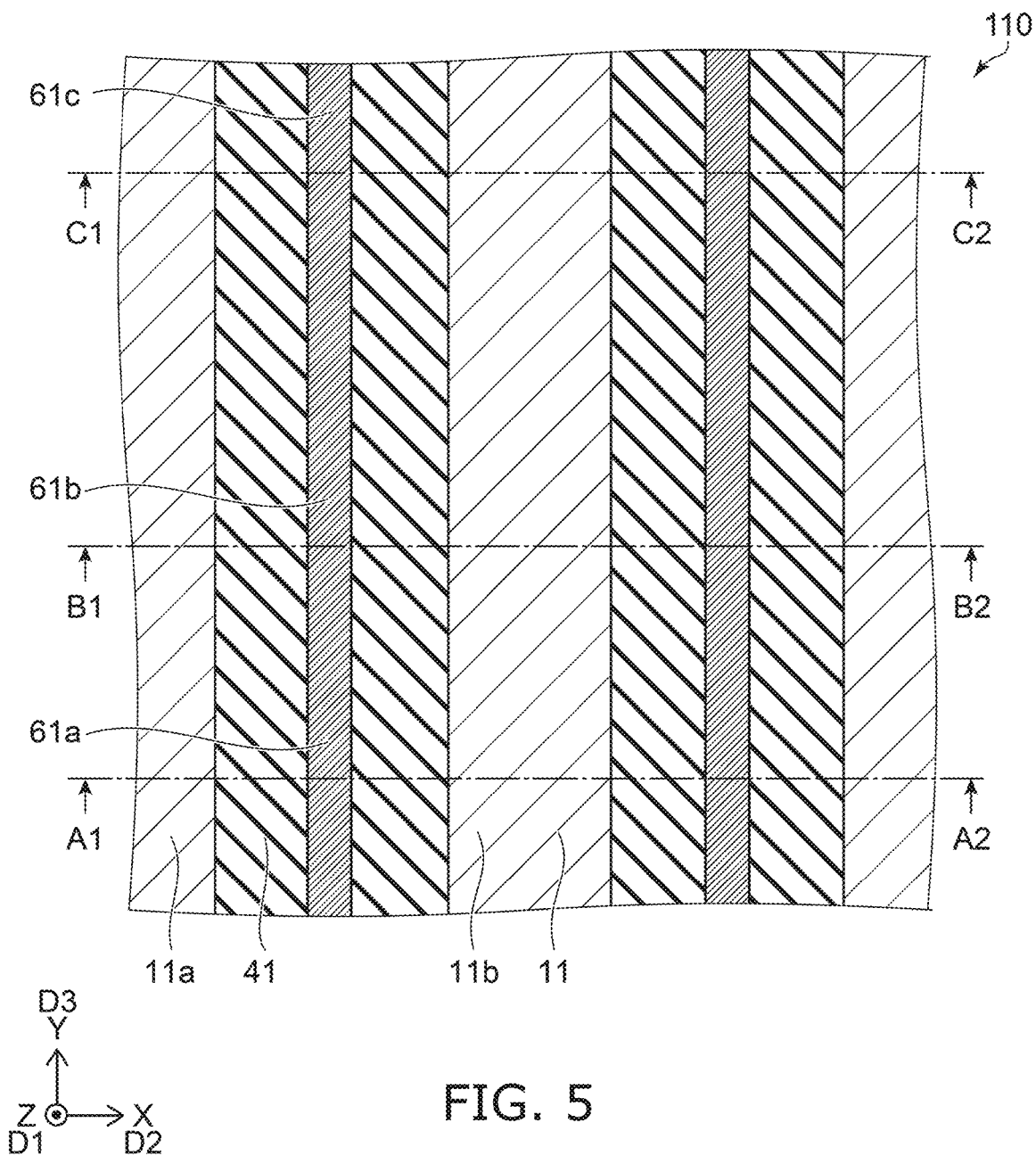
FIG. 5 is a schematic cross-sectional view illustrating the semiconductor device according to the first embodiment.

FIG. 1 is a cross-sectional view taken along line A1-A2 of FIGS. 4 and 5. FIG. 2 is a cross-sectional view taken along line B1-B2 of FIGS. 4 and 5. FIG. 3 is a cross-sectional view taken along line C1-C2 of FIGS. 4 and 5. FIG. 4 is a cross-sectional view taken along line E1-E2 of FIGS. 1 to 3. FIG. 5 is a cross-sectional view taken along line F1-F2 of FIGS. 1 to 3.

As shown in these figures, a semiconductor device 110 according to the embodiment includes a first electrode 51, a second electrode 52, a third electrode 53, a semiconductor member 10, a first conductive member 61, a connecting member 55M, and a first member 58a, and an insulating member 41.

As shown in FIG. 1, the semiconductor member 10 includes a first semiconductor region 11 of a first conductive type, a second semiconductor region 12 of a second conductive type, and a third semiconductor region 13 of the first conductive type. The first conductive type is one of an n type and a p type. The second conductive type is the other of the n type and the p type. For example, the first conductive type is the n type, and the second conductive type is the p type. The semiconductor member 10 includes, for example, silicon or SiC.

The first semiconductor region 11 is between the first electrode 51 and the third semiconductor region 13. The second semiconductor region 12 is between the first semiconductor region 11 and the third semiconductor region 13.

A direction from the first electrode 51 to the third semiconductor region 13 is defined as a first direction D1. The first direction D1 is defined as a Z-axis direction. One direction perpendicular to the Z-axis direction is defined as an X-axis direction. A direction perpendicular to the Z-axis direction and the X-axis direction is defined as a Y-axis direction.

For example, the first semiconductor region 11 includes a first partial region 11a, a second partial region 11b, and a third partial region 11c. The first semiconductor region 11 may further include a fourth partial region 11d and a fifth partial region 11e. The boundaries of these partial regions may be unclear.

As shown in FIG. 1, the third semiconductor region 13 includes a first semiconductor portion 13a and a second semiconductor portion 13b. A second direction D2 from the first semiconductor portion 13a to the second semiconductor portion 13b crosses the first direction D1 from the first electrode 51 to the third semiconductor region 13. The second direction D2 is, for example, the X-axis direction.

The second semiconductor region 12 includes a third semiconductor portion 12c and a fourth semiconductor portion 12d. A direction from the third semiconductor portion 12c to the fourth semiconductor portion 12d is along the second direction D2. The third semiconductor portion 12c is between the first portion region 11a and the first semiconductor portion 13a in the first direction D1. The fourth semiconductor portion 12d is between the second portion region 11b and the second semiconductor portion 13b in the first direction D1.

A position of the third partial region 11c in the second direction D2 is between a position of the first partial region 11a in the second direction D2 and a position of the second partial region 11b in the second direction D2. The fourth partial region 11d is, for example, between the first partial region 11a and the third partial region 11c. The fifth partial region 11e is between the third partial region 11c and the second partial region 11b.

In the semiconductor member 10, the first semiconductor region 11 may correspond to, for example, a drift layer. The second semiconductor region 12 may correspond to, for example, a base layer. The third semiconductor region 13 may correspond to, for example, a source layer.

The second electrode 52 is electrically connected with the third semiconductor region 13. In this example, the semiconductor member 10 is provided between the first electrode 51 and the second electrode 52. A conductive layer 52L for the second electrode may be provided between the third semiconductor region 13 and the second electrode 52. The conductive layer 52L for the second electrode may include, for example, a stacked film such as a Ti film/TiN film/W film. The conductive layer 52L for the second electrode may include, for example, a contact region 52a. The contact region 52a is electrically connected with the second semiconductor region 12 and the third semiconductor region 13.

The third electrode 53 includes a first electrode portion 53a. The first electrode portion 53a is between the first semiconductor portion 13a and the second semiconductor portion 13b and between the third semiconductor portion 12c and the fourth semiconductor portion 12d in the second direction D2. In this example, a part of the first electrode portion 53a overlaps the fourth partial region 11d in the first direction D1. Another part of the first electrode portion 53a overlaps the fifth portion region 11e in the first direction D1.

The first conductive member 61 includes a first conductive region 61a, a second conductive region 61b, and a third conductive region 61c. The boundaries between these conductive regions may be unclear. As shown in FIG. 1, the first conductive region 61a is between the first partial region 11a and the second partial region 11b in the second direction D2. A position of the first conductive region 61a in the first direction D1 is between a position of the third partial region 11c in the first direction D1 and a position of the first electrode portion 53a in the first direction D1.

As shown in FIG. 5, the second conductive region 61b is between the first conductive region 61a and the third conductive region 61c in a third direction D3. The third direction D3 crosses a plane including the first direction D1 and the second direction D2. The third direction D3 is, for example, the Y-axis direction. The second conductive region 61b is continuous with the first conductive region 61a and the third conductive region 61c in the third direction D3.

As shown in FIG. 3, the connecting member 55M is electrically connected with the first conductive member 61. A direction from the third conductive region 61c to the connecting member 55M is along the first direction D1.

As shown in FIG. 4, the first member 58a is provided between the first electrode portion 53a and the connecting member 55M in the third direction D3. As shown in FIG. 2, a position of the second conductive region 61b in the first direction D1 is between a position of the third partial region 11c in the first direction D1 and a position of the first member 58a in the first direction D1. In the embodiment, the first member 58a includes an element different from the element included in the second conductive region 61b. The connecting member 55M, the first member 58a, and the third electrode 53 are electrically connected with each other. The first member 58a is continuous with the first electrode portion 53a and the connecting member 55M in the third direction D3.

The insulating member 41 is provided between the semiconductor member 10 and the third electrode 53, between the semiconductor member 10 and the first conductive member 61, between the first conductive member 61 and the third electrode 53, and between the first conductive member 61 and the first member 58a. The insulating member 41 electrically insulates these conductive portions.

For example, the insulating member 41 includes a first insulating region 41a, a second insulating region 41b, and a third insulating region 41c. The first insulating region 41a is provided between the first semiconductor portion 13a and the first electrode portion 53a, and between the third semiconductor portion 12c and the first electrode portion 53a. The second insulating region 41b is provided between the first electrode portion 53a and the second semiconductor portion 13b, and between the first electrode portion 53a and the fourth semiconductor portion 12d. The third insulating region 41c is provided between the first conductive member 61 and the first electrode portion 53a.

The current flowing between the first electrode 51 and the second electrode 52 can be controlled by a potential of the third electrode 53. The potential of the third electrode 53 is, for example, a potential based on the potential of the second electrode 52. The first electrode 51 functions as, for example, a drain electrode. The second electrode 52 functions as, for example, a source electrode. The third electrode 53 functions as, for example, a gate electrode. The first insulating region 41a and the second insulating region 41b function as, for example, a gate insulating film. The semiconductor device 110 is, for example, a transistor (for example, a MOS type transistor).

In the embodiment, the first member 58a is provided as described above. The first member 58a includes an element different from the element included in the second conductive region 61b. For example, an electrical resistance of the first member 58a is higher than an electrical resistance of the second conductive region 61b.

For example, the second conductive region 61b includes a first element. The first member 58a includes the first element and a second element. The first element includes one of a third element and a fourth element. The second element includes the other of the third element and the fourth element. The third element includes at least one selected from the group consisting of phosphorus, arsenic and antimony. The fourth element includes at least one selected from the group consisting of boron, aluminum and gallium.

For example, the second conductive region 61b includes phosphorus. The first member 58a includes phosphorus and boron. The second conductive region 61b and the first member 58a include at least one of silicon or SiC. For example, the second conductive region 61b is a semiconductor region including a p-type impurity. The electrical resistance in the second conductive region 61b is low. On the other hand, the first member 58a is a semiconductor region including both p-type and n-type impurities. The conductivity of the second conductive region 61b is higher than that of the first member 58a. The second conductive region 61b is a low resistance region. The first member 58a is a high resistance region.

For example, a gate pulse is applied from a drive circuit to the connecting member 55M electrically connected with the third electrode 53. The gate pulse is applied to the first conductive region 61a via the second conductive region 61b in the low resistance region. The gate pulse is applied to the third electrode 53 (first electrode portion 53a) via the first member 58a in the high resistance region. One gate pulse is applied to the first conductive region 61a and the first electrode portion 53a via current paths of different resistances. This shortens, for example, the mirror period. For example, loss can be suppressed. According to the embodiment, it is possible to provide a semiconductor device capable of reducing loss.

In the embodiment, for example, the loss can be suppressed while maintaining a low surge voltage. For example, the surge voltage can be suppressed while maintaining a low loss. For example, the trade-off between loss and surge voltage can be improved. For example, low loss and high breakdown voltage can be obtained.

For example, a reference example in which the first conductive member 61 is electrically separated from the third electrode 53 can be considered. In this reference example, a gate pulse is supplied from the first circuit to the third electrode 53. Another gate pulse is supplied to the first conductive member 61 from the second circuit different from the first circuit. In such a reference example, the trade-off between loss and surge voltage may be improved. However, in this reference example, multiple circuits are required, which is disadvantageous from the viewpoint of practicality. Circuit design is complicated in order to match the characteristics of multiple circuits with high accuracy. The cost goes up.

On the other hand, in the embodiment, one gate pulse from one circuit may be supplied to the connecting member 55M. Between the current path between the connecting member 55M and the first conductive region 61a (second conductive region 61b) and the current path between the connecting member 55M and the third electrode 53 (first member 58a), a difference in electrical resistance is provided. As a result, potential changes with different transient characteristics can be obtained between the first conductive region 61a and the third electrode 53. For example, the first conductive region 61a responds to the gate pulse at high speed. For example, the third electrode 53 responds slowly to the gate pulse. This allows the mirror period to be shortened appropriately. As a result, the loss can be suppressed. For example, the time change of the current can be moderated. As a result, the surge voltage can be suppressed.

In the embodiment, the first member 58a electrically connects the first electrode portion 53a with the connecting member 55M. The resistance of this electrical connection is higher than the electrical resistance through the second conductive region 61b.

In the embodiment, the second conductive region 61b is substantially free of, for example, a second element (e.g., boron). Alternatively, a concentration of the second element in the second conductive region 61b is not more than 1/10 of a concentration of the second element in the first member 58a. Low resistance is obtained in the second conductive region 61b. At this time, a concentration of the first element in the second conductive region 61b may be substantially the same as a concentration of the first element in the first member 58a. For example, the concentration of the first element in the second conductive region 61b may be not less than 0.5 times and not more than 2 times the concentration of the first element in the first member 58a.

In the embodiment, the first electrode portion 53a is substantially free of, for example, the second element. Alternatively, a concentration of the second element in the first electrode portion 53a is not more than 1/10 of the concentration of the second element in the first member 58a. Low resistance is obtained at the first electrode portion 53a. At this time, a concentration of the first element in the first electrode portion 53a may be substantially the same as the concentration of the first element in the first member 58a. For example, the concentration of the first element in the first electrode portion 53a may be not less than 0.5 times and not more than 2 times the concentration of the first element in the first member 58a.

In the embodiment, the connecting member 55M does not include the second element. Alternatively, a concentration of the second element in the connecting member 55M is not more than 1/10 of the concentration of the second element in the first member 58a. Low resistance is obtained in the connecting member 55M. At this time, a concentration of the first element in the connecting member 55M may be substantially the same as the concentration of the first element in the first member 58a. For example, the concentration of the first element in the connecting member 55M may be not less than 0.5 times and not more than 2 times the concentration of the first element in the first member 58a.

As shown in FIG. 1, in this example, the semiconductor device 110 further includes a third conductive member 63. A position of the third conductive member 63 in the first direction D1 is between a position of the third partial region 11c in the first direction D1 and a position of the first conductive member 61 in the first direction D1. For example, the third conductive member 63 is electrically connected with the second electrode 52. Alternatively, the third conductive member 63 can be electrically connected with the second electrode 52.

For example, a terminal 52T electrically connected with the second electrode 52 may be provided. For example, a terminal 63T electrically connected with the third conductive member 63 may be provided. These terminals may be electrically connected by wiring 63L.

By providing the third conductive member 63, for example, local concentration of the electric field can be suppressed. For example, higher breakdown voltage can be obtained.

As shown in FIG. 1, multiple structures including the third electrode 53, the first conductive member 61, and the third conductive member 63 may be arranged in the X-axis direction.

For example, the first semiconductor region 11 is provided on the first electrode 51. The second semiconductor region 12 is provided on the first semiconductor region 11. The third semiconductor region 13 is provided on the second semiconductor region 12. A trench 10T is provided in the semiconductor member including these semiconductor regions. The third electrode 53, the first conductive member 61, and the third conductive member 63 are provided inside the trench 10T. The second electrode 52 is provided on the semiconductor member 10. Multiple trenches 10T may be arranged along the X-axis direction.

FIGS. 6 to 10 are schematic cross-sectional views illustrating a semiconductor device according to the first embodiment.

Figure 6:
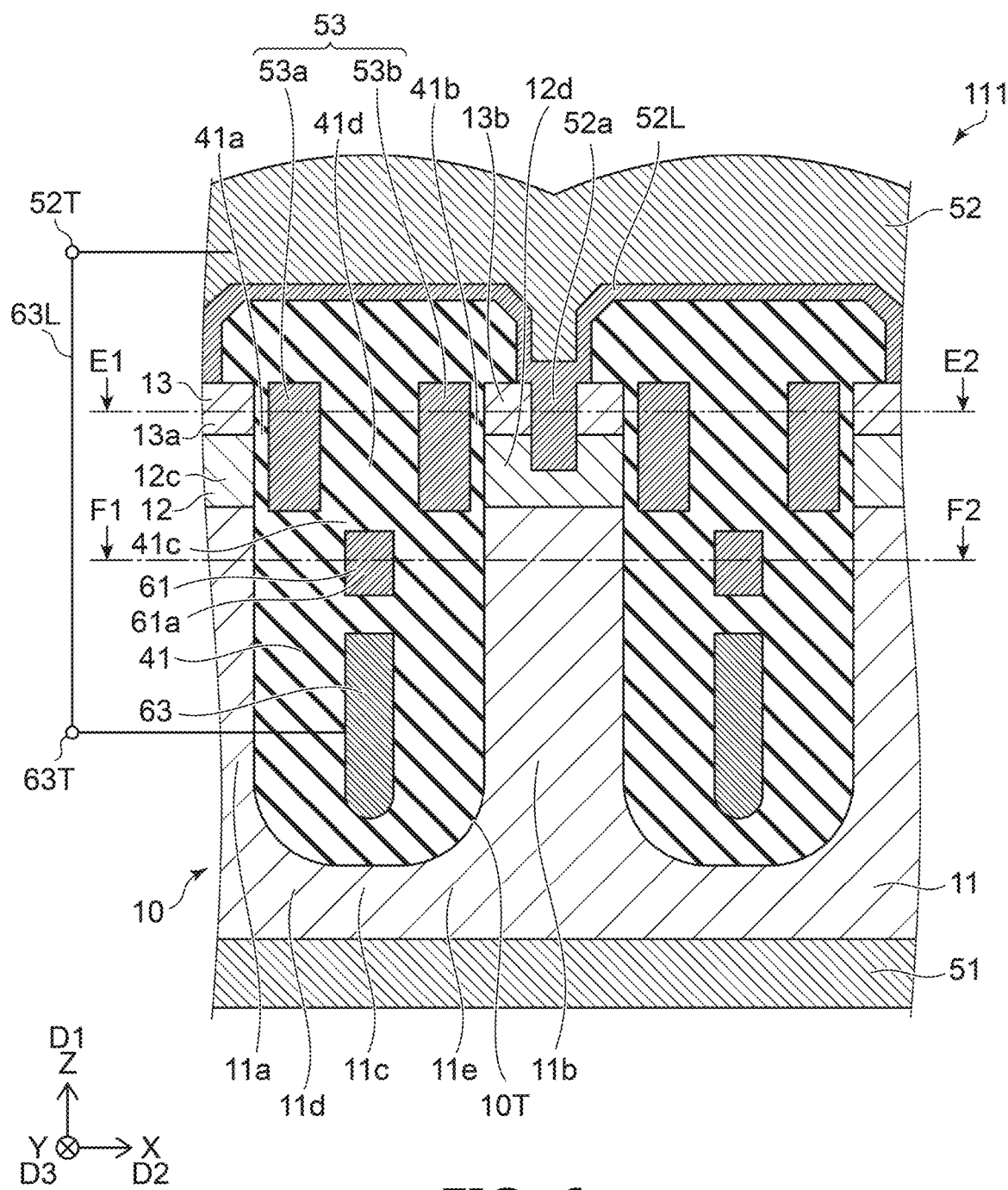
FIG. 6 is a schematic cross-sectional view illustrating a semiconductor device according to the first embodiment.
Figure 7:
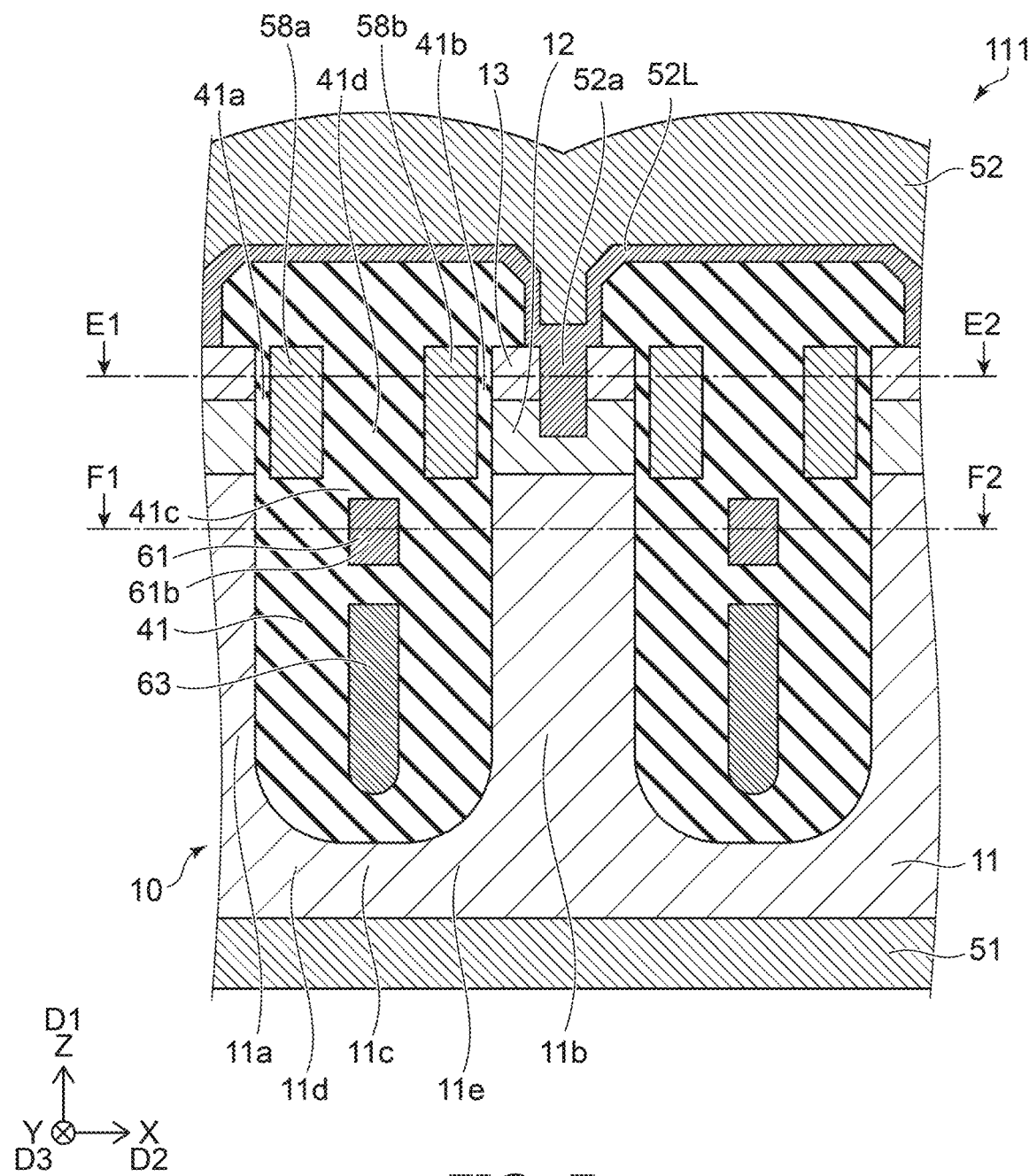
FIG. 7 is a schematic cross-sectional view illustrating the semiconductor device according to the first embodiment.
Figure 8:
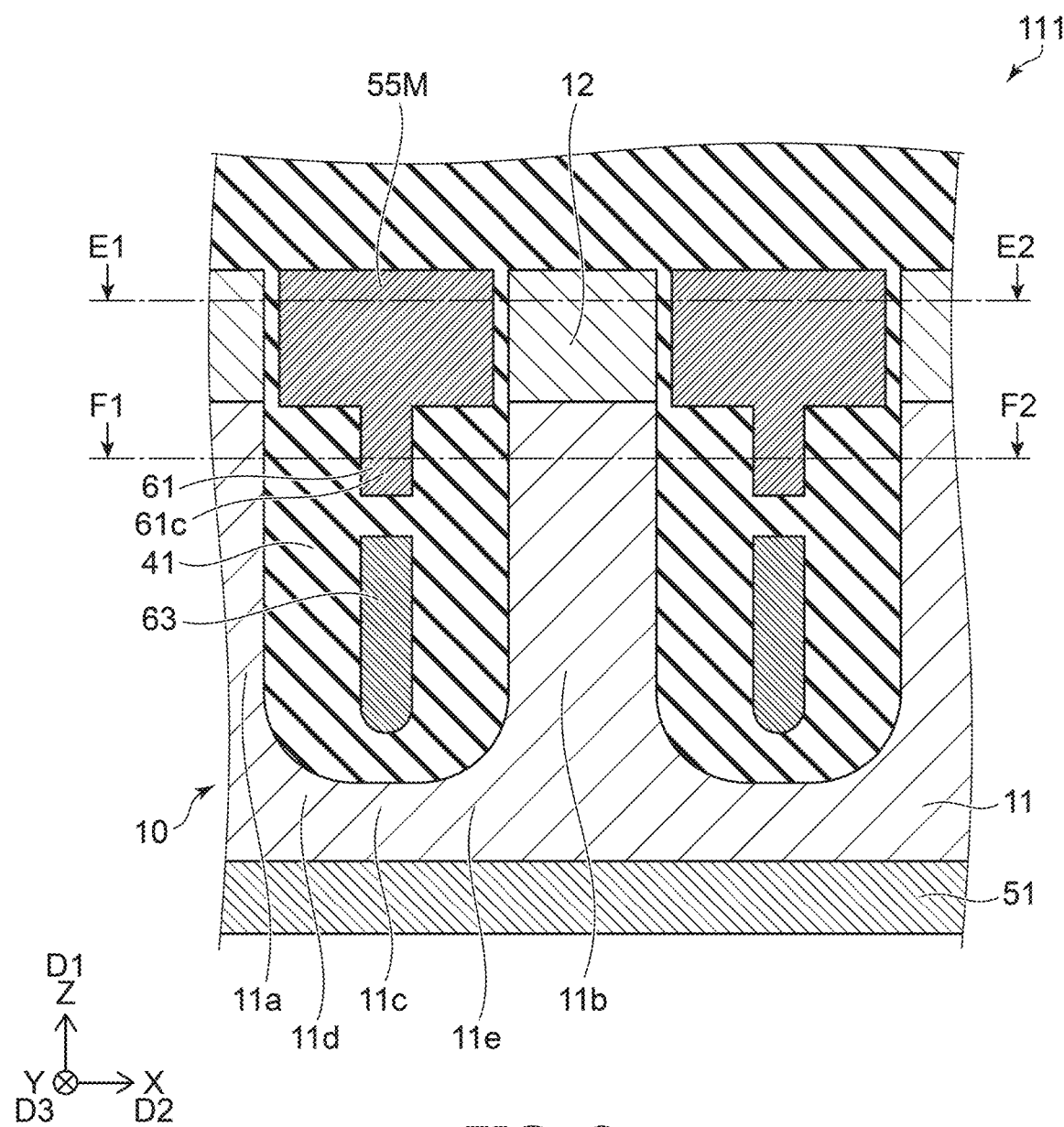
FIG. 8 is a schematic cross-sectional view illustrating the semiconductor device according to the first embodiment.
Figure 9:
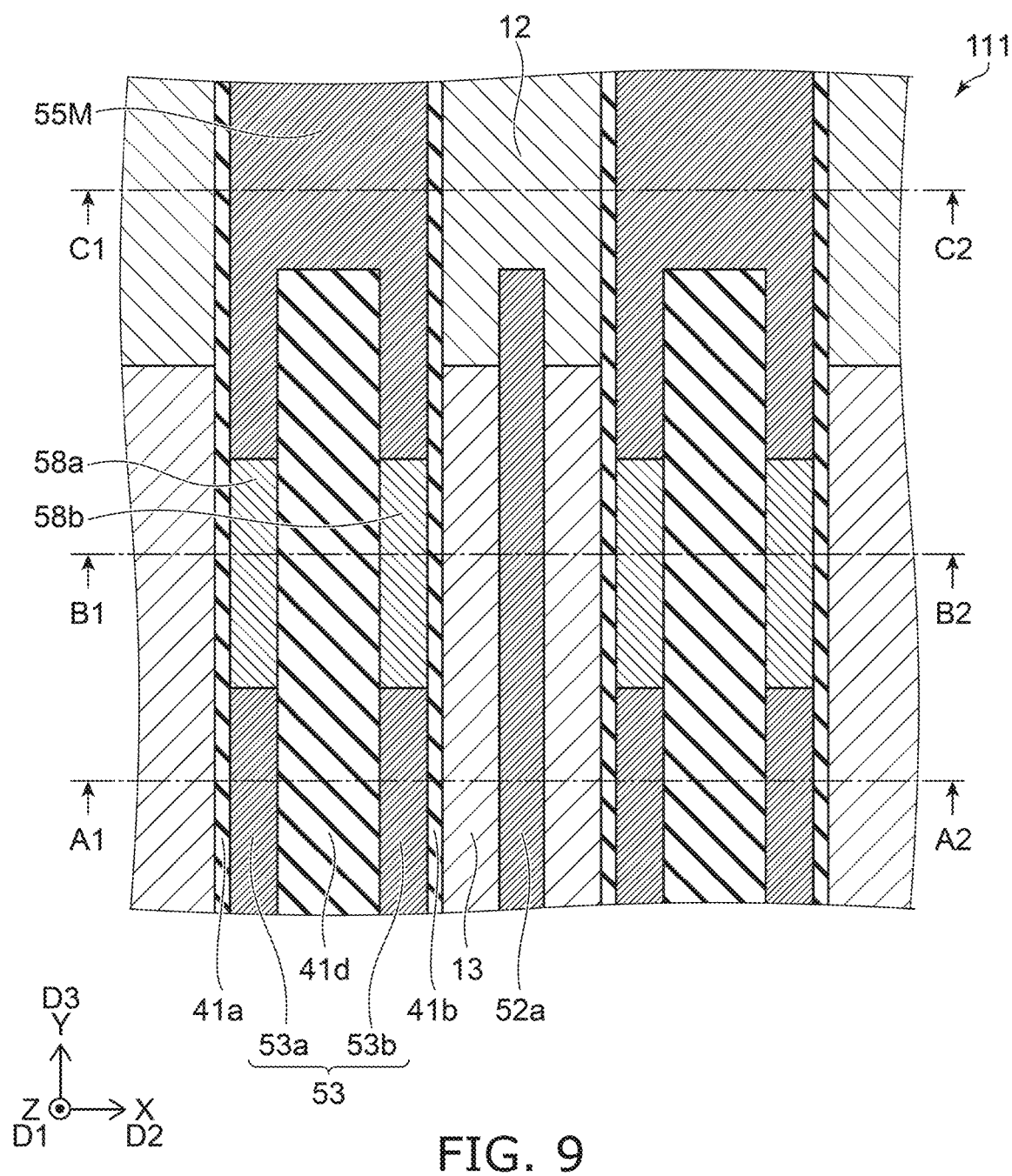
FIG. 9 is a schematic cross-sectional view illustrating the semiconductor device according to the first embodiment.
Figure 10:
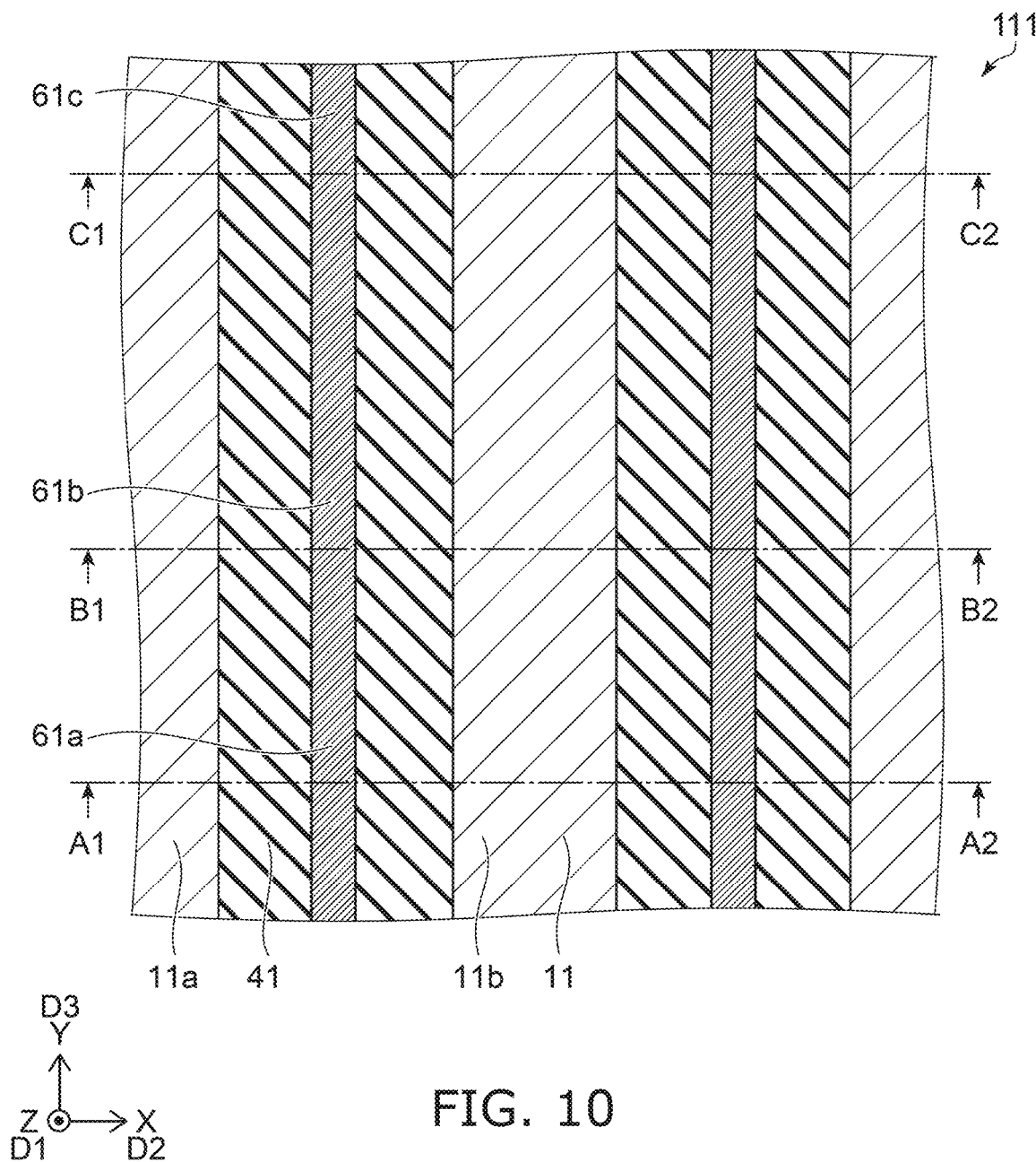
FIG. 10 is a schematic cross-sectional view illustrating the semiconductor device according to the first embodiment.

FIG. 6 is a cross-sectional view taken along line A1-A2 of FIGS. 9 and 10. FIG. 7 is a cross-sectional view taken along line B1-B2 of FIGS. 9 and 10. FIG. 8 is a cross-sectional view taken along line C1-C2 of FIGS. 9 and 10. FIG. 9 is a cross-sectional view taken along line E1-E2 of FIGS. 6 to 8. FIG. 10 is a cross-sectional view taken along line F1-F2 of FIGS. 6 to 8.

As shown in FIGS. 6 to 10, in a semiconductor device 111 according to the embodiment, the third electrode 53 further includes a second electrode portion 53b in addition to the first electrode portion 53a. Except for this, the configuration of the semiconductor device 111 may be the same as the configuration of the semiconductor device 110.

The second electrode portion 53b is between the first electrode portion 53a and the second semiconductor portion 13b and between the first electrode portion 53a and the fourth semiconductor portion 12d in the second direction D2. A part of the insulating member 41 is between the first electrode portion 53a and the second electrode portion 53b. In this example, at least a part of the first electrode portion 53a overlaps the fourth portion region 11d in the first direction D1. At least a part of the second electrode portion 53b overlaps the fifth portion region 11e in the first direction D1.

For example, the insulating member 41 includes the first to fourth insulating regions 41a to 41d. The first insulating region 41a is provided between the first semiconductor portion 13a and the first electrode portion 53a, and between the third semiconductor portion 12c and the first electrode portion 53a. The second insulating region 41b is provided between the second electrode portion 53b and the second semiconductor portion 13b, and between the second electrode portion 53b and the fourth semiconductor portion 12d. The third insulating region 41c is provided between the first conductive member 61 and the first electrode portion 53a, and between the first conductive member 61 and the second electrode portion 53b. The fourth insulating region 41d is provided between the first electrode portion 53a and the second electrode portion 53b.

As shown in FIG. 6, in this example, at least a part of the first conductive region 61a does not overlap the first electrode portion 53a and the second electrode portion 53b in the first direction D1. At least a part of the first conductive region 61a is provided between the third conductive member 63 and the fourth insulating region 41d in the first direction D1. In this example, a position of the first conductive region 61a in the second direction D2 is between a position of the first electrode portion 53a in the second direction D2 and a position of the second electrode portion 53b in the second direction D2.

As shown in FIGS. 7 and 9, in this example, the semiconductor device 111 further includes a second member 58b in addition to the first member 58a. As shown in FIG. 9, the second member 58b is provided between the second electrode portion 53b and the connecting member 55M in the third direction D3. The second member 58b includes an element different from the element included in the second conductive region 61b. For example, the second conductive region 61b includes the first element. The second member 58b includes the first element and the second element. The first element includes one of the third element and the fourth element. The second element includes the other of the third element and the fourth element. The third element includes at least one selected from the group consisting of phosphorus, arsenic and antimony. The fourth element includes at least one selected from the group consisting of boron, aluminum and gallium. The second portion 58b includes at least one of silicon or SiC. A part of the insulating member 41 is provided between the second conductive region 61b and the second member 58b. The second member 58b functions as, for example, a high resistance region.

Also in the semiconductor device 111, for example, the mirror period is shortened. For example, loss can be suppressed. According to the embodiment, it is possible to provide a semiconductor device capable of reducing loss.

FIGS. 11 to 15 are schematic cross-sectional views illustrating a semiconductor device according to the first embodiment.

Figure 11:
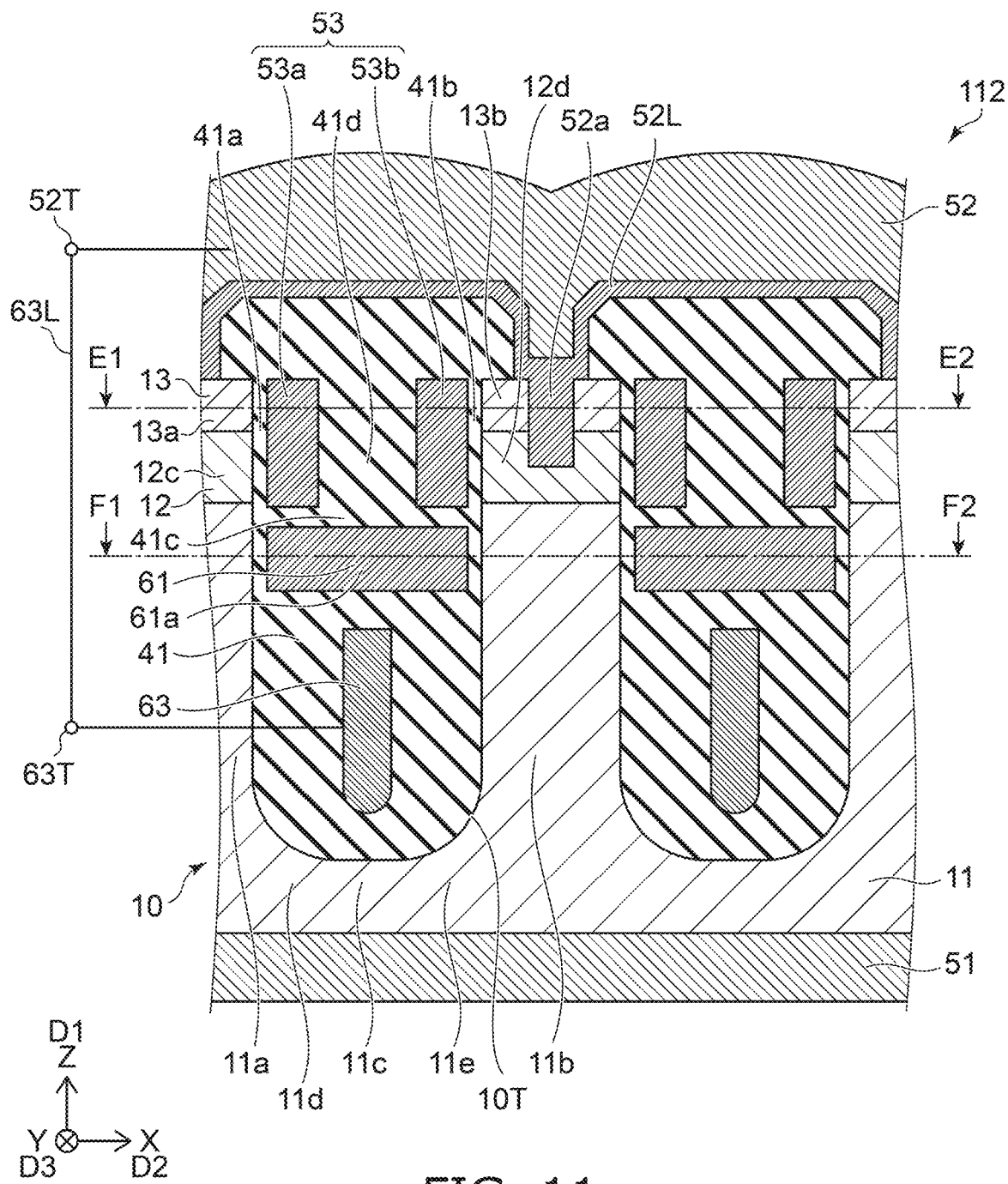
FIG. 11 is a schematic cross-sectional view illustrating a semiconductor device according to the first embodiment.
Figure 12:
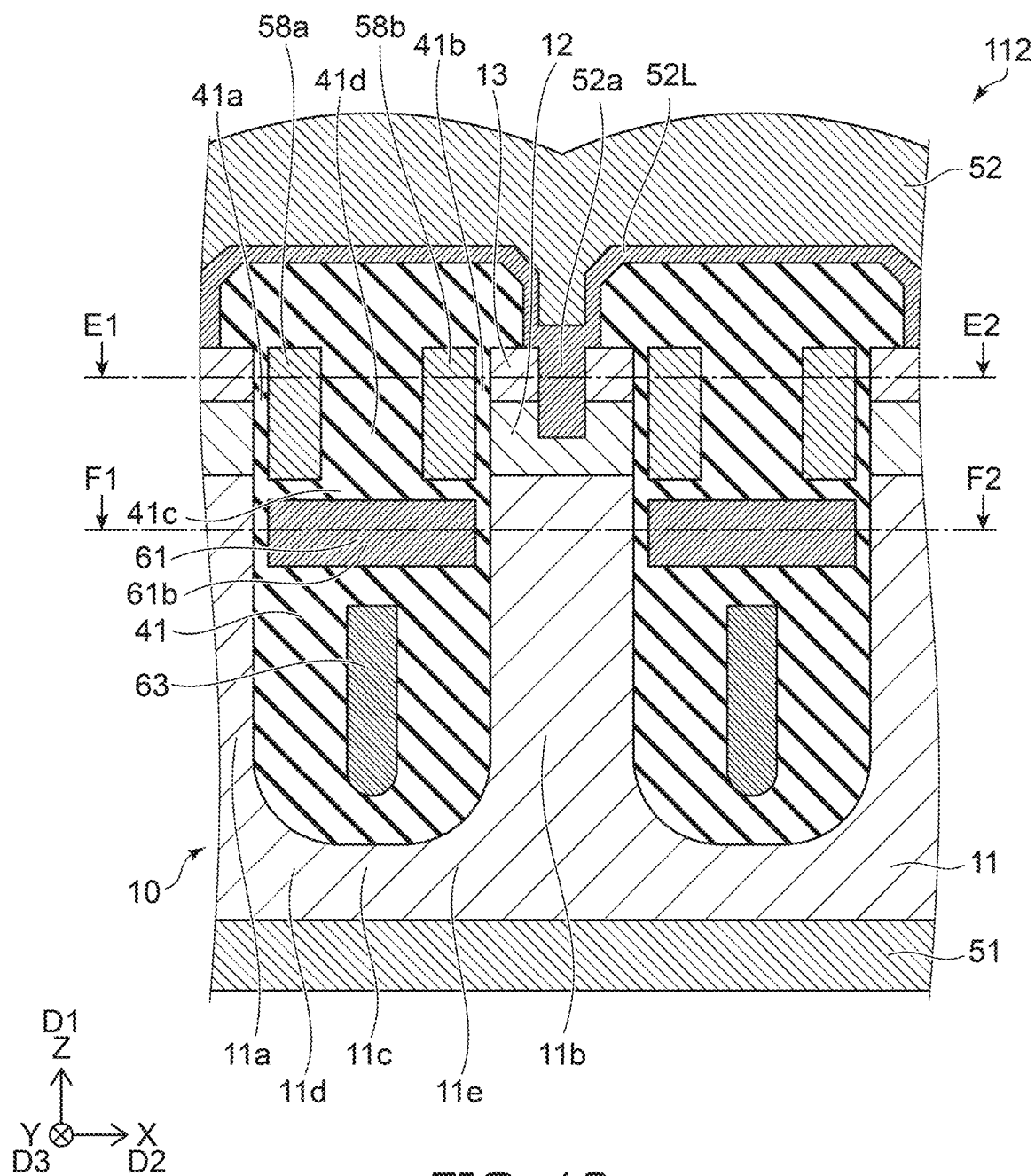
FIG. 12 is a schematic cross-sectional view illustrating the semiconductor device according to the first embodiment.
Figure 13:
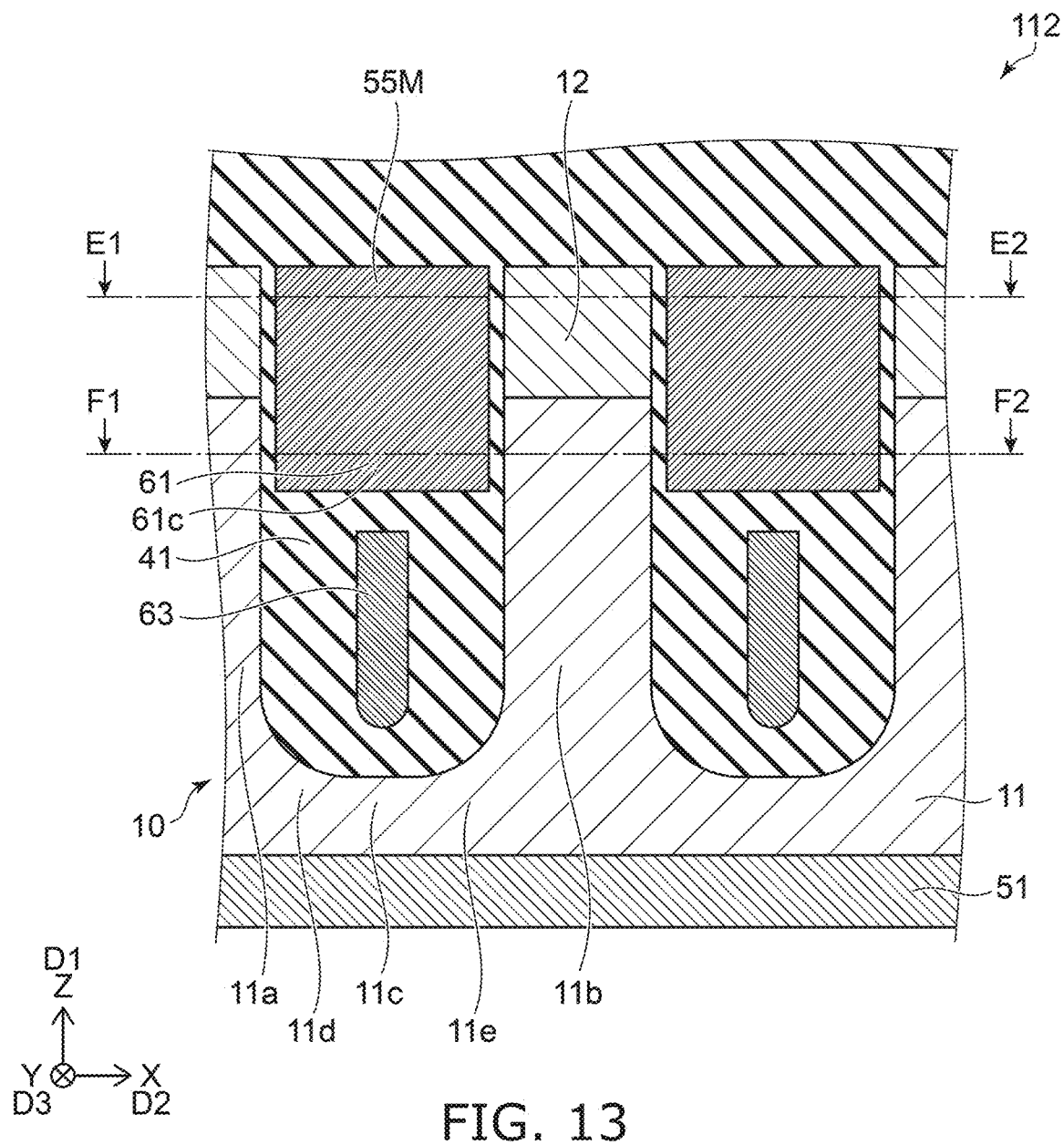
FIG. 13 is a schematic cross-sectional view illustrating the semiconductor device according to the first embodiment.
Figure 14:
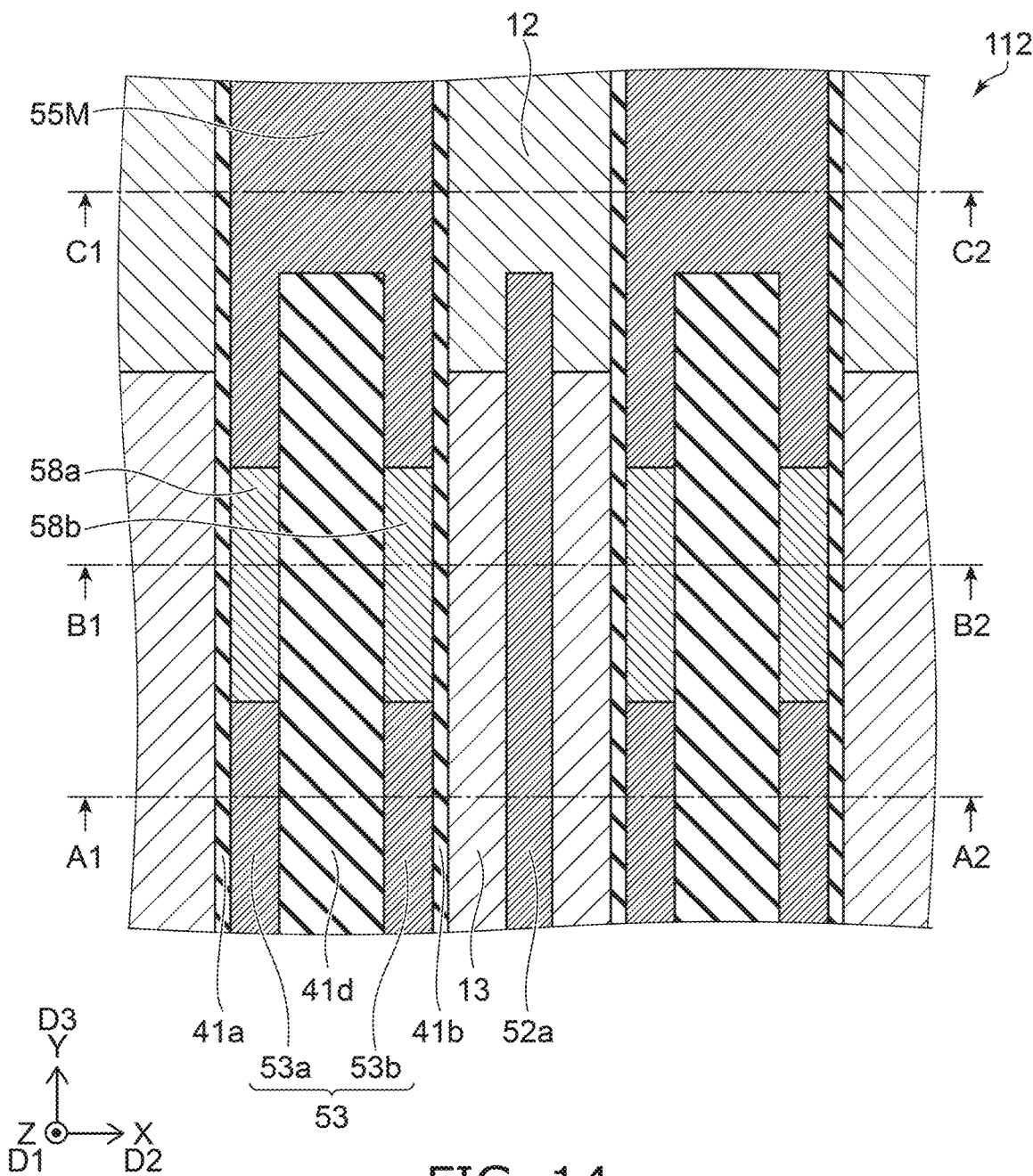
FIG. 14 is a schematic cross-sectional view illustrating the semiconductor device according to the first embodiment.
Figure 15:
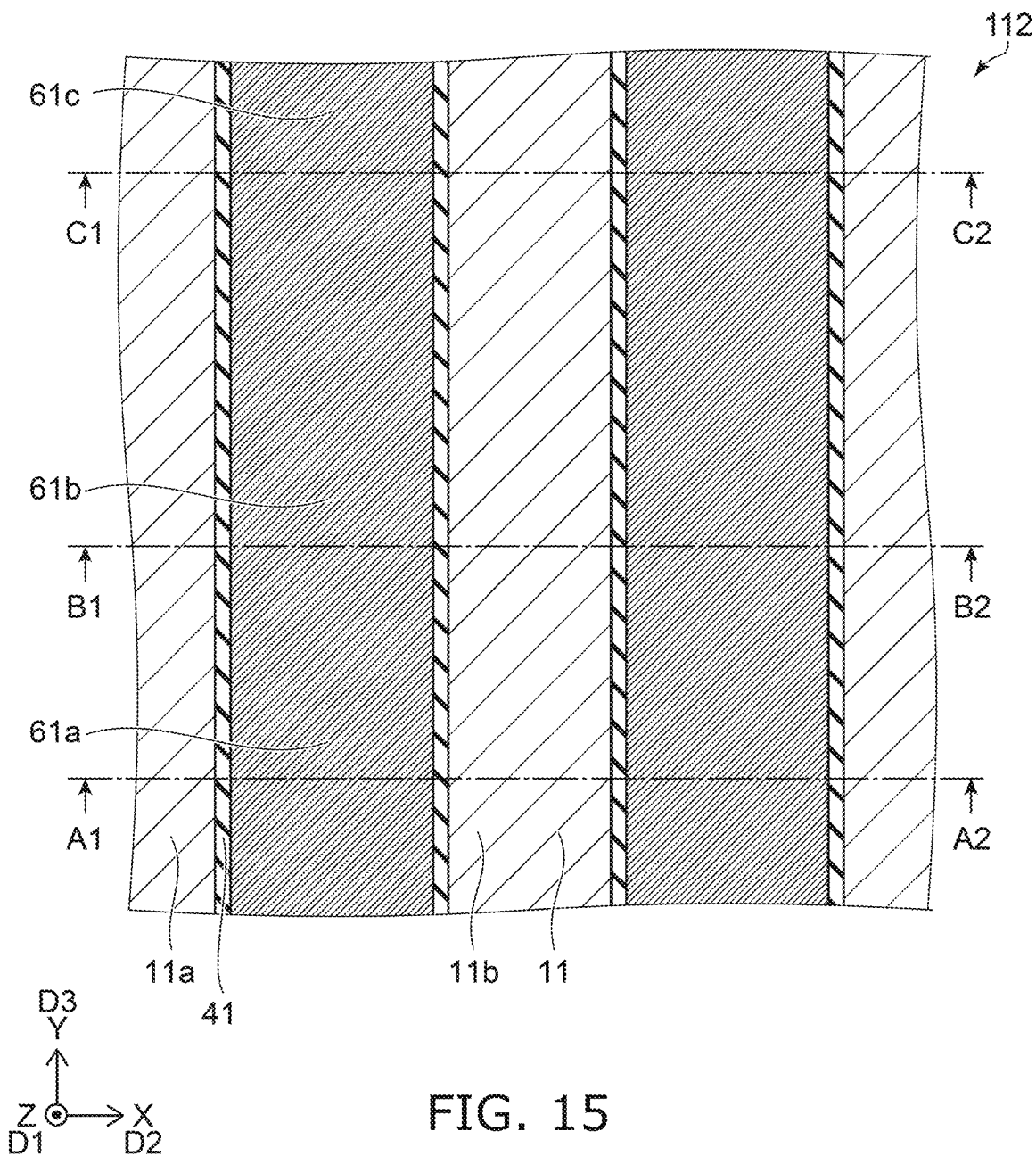
FIG. 15 is a schematic cross-sectional view illustrating the semiconductor device according to the first embodiment.

FIG. 11 is a cross-sectional view taken along line A1-A2 of FIGS. 14 and 15. FIG. 12 is a cross-sectional view taken along line B1-B2 of FIGS. 14 and 15. FIG. 13 is a cross-sectional view taken along line C1-C2 of FIGS. 14 and 15. FIG. 14 is a cross-sectional view taken along line E1-E2 of FIGS. 11 to 13. FIG. 15 is a cross-sectional view taken along line F1-F2 of FIGS. 11 to 13.

As shown in FIGS. 11 to 15, in a semiconductor device 112 according to the embodiment, the third electrode 53 also includes the first electrode portion 53a and the second electrode portion 53b. As shown in FIG. 11, in the semiconductor device 112, a part of the first conductive region 61a overlaps a part of the insulating member 41 in the first direction D1. Another part of the first conductive region 61a overlaps the first electrode portion 53a and the second electrode portion 53b in the first direction D1. Except for this, the configuration of the semiconductor device 112 may be the same as the configuration of the semiconductor device 111.

In the semiconductor device 112, a width of the first conductive member 61 in the X-axis direction is wide. An electrical resistance of the first conductive member 61 can be made lower. The loss can be further reduced.

FIGS. 16 to 20 are schematic cross-sectional views illustrating a semiconductor device according to the first embodiment.

Figure 16:
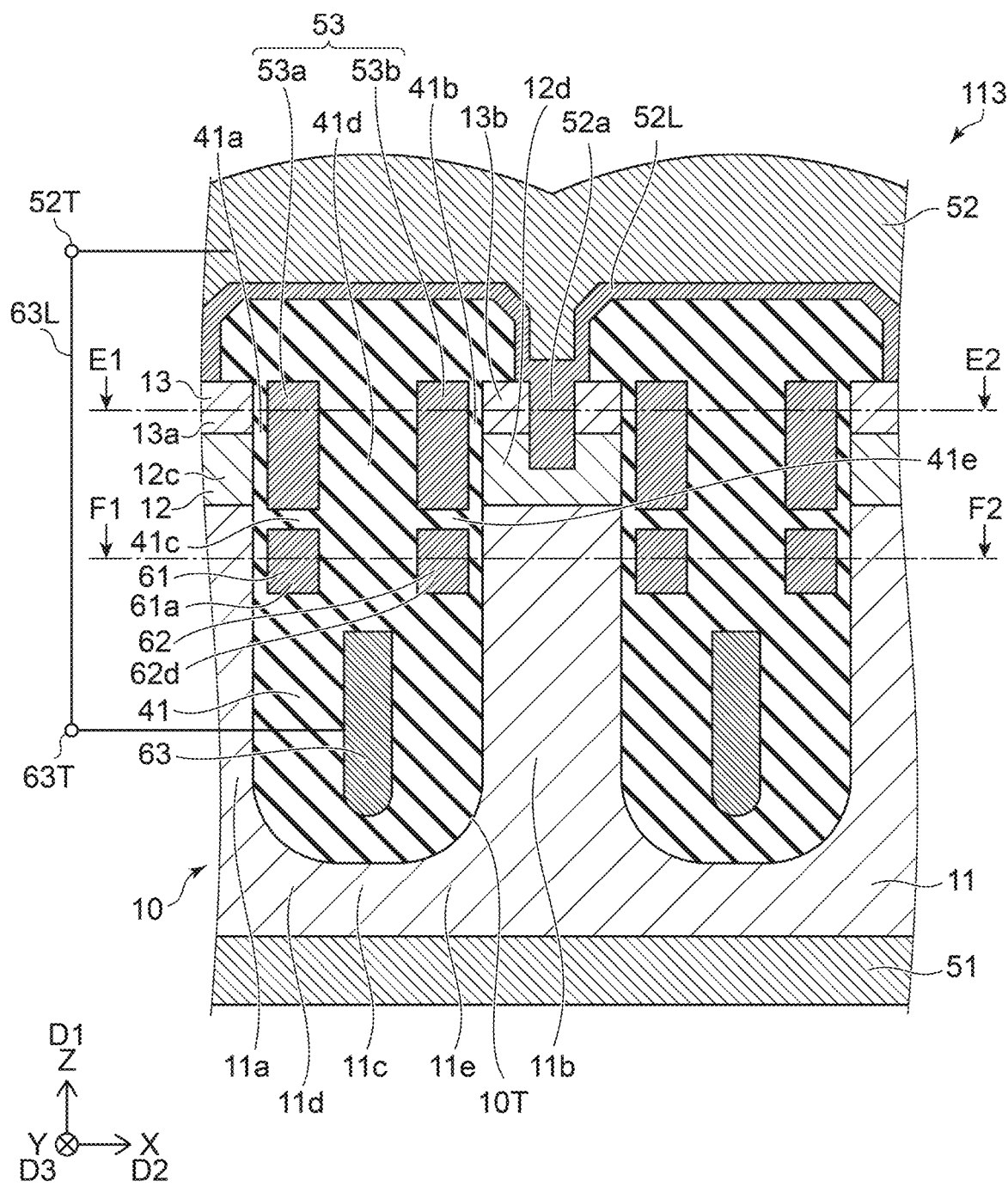
FIG. 16 is a schematic cross-sectional view illustrating a semiconductor device according to the first embodiment.
Figure 17:
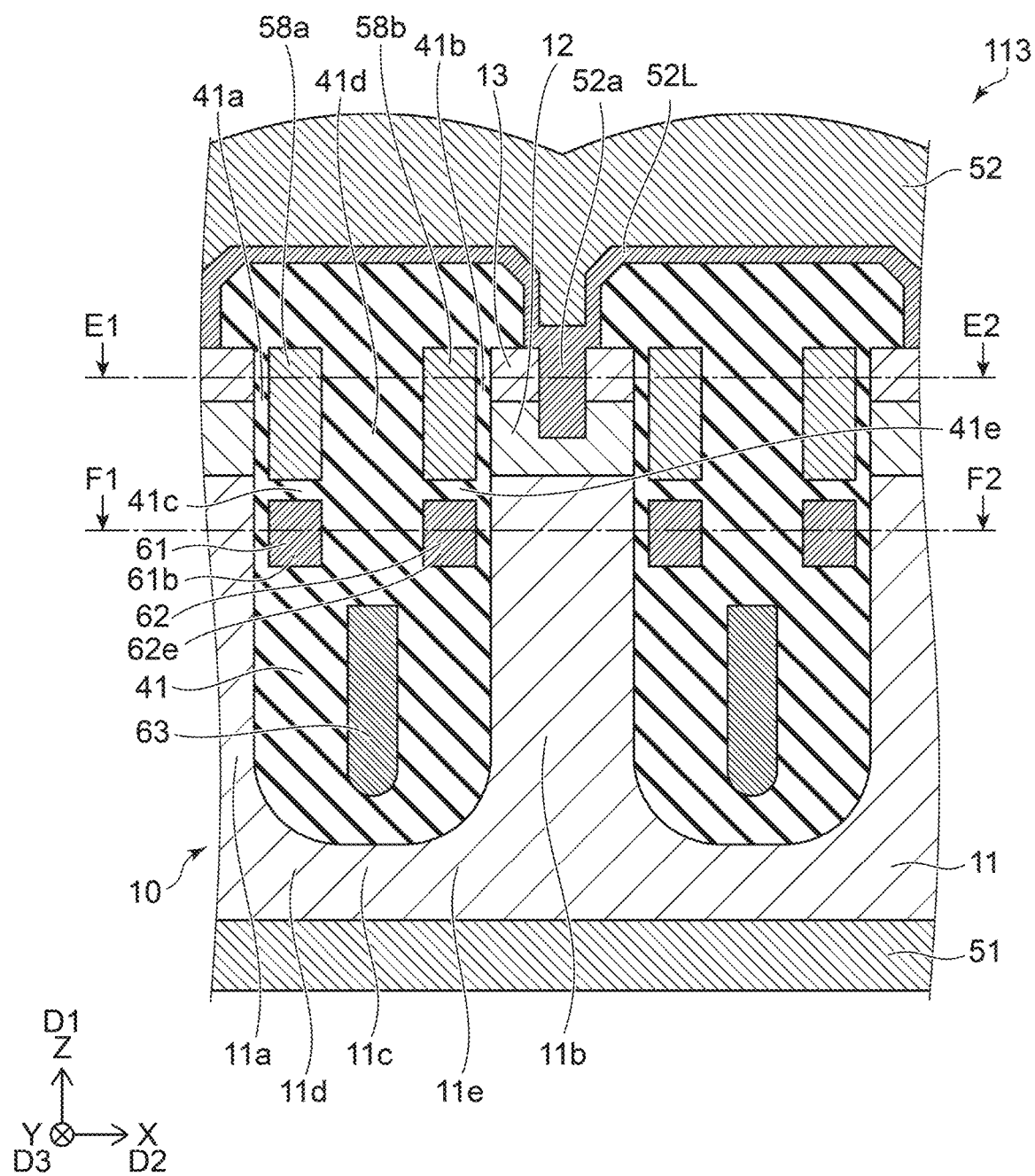
FIG. 17 is a schematic cross-sectional view illustrating the semiconductor device according to the first embodiment.
Figure 18:
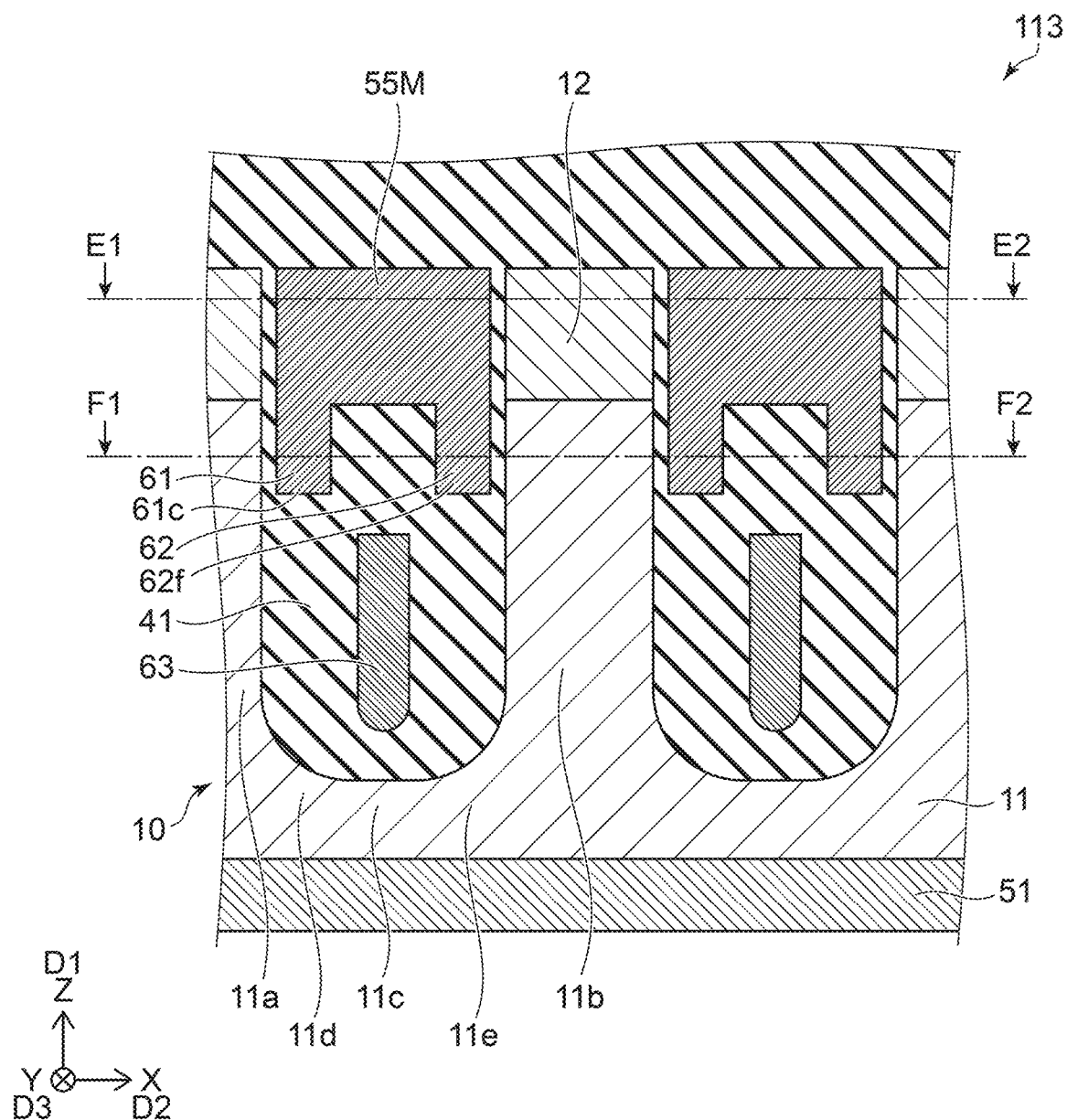
FIG. 18 is a schematic cross-sectional view illustrating the semiconductor device according to the first embodiment.
Figure 19:
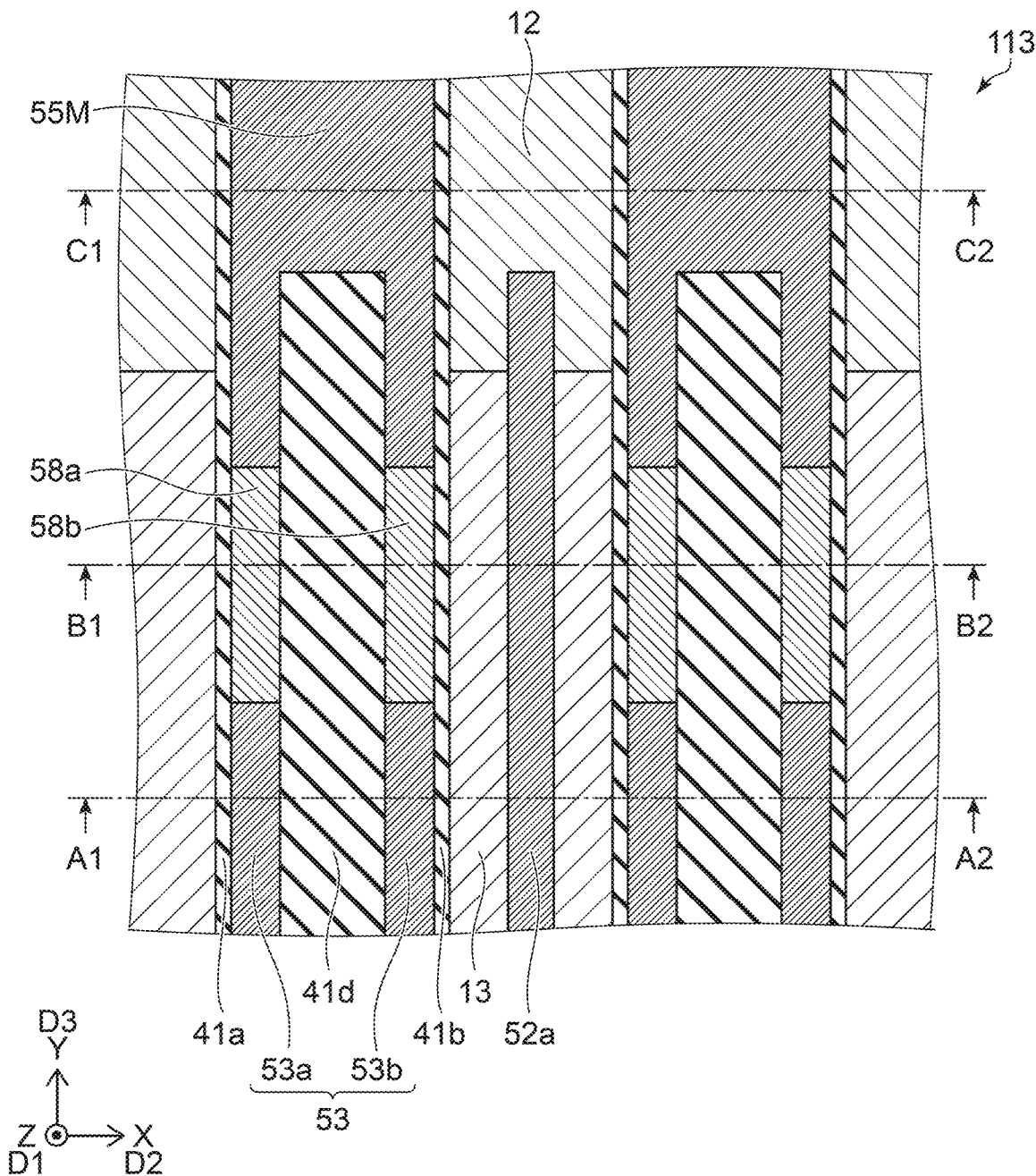
FIG. 19 is a schematic cross-sectional view illustrating the semiconductor device according to the first embodiment.
Figure 20:
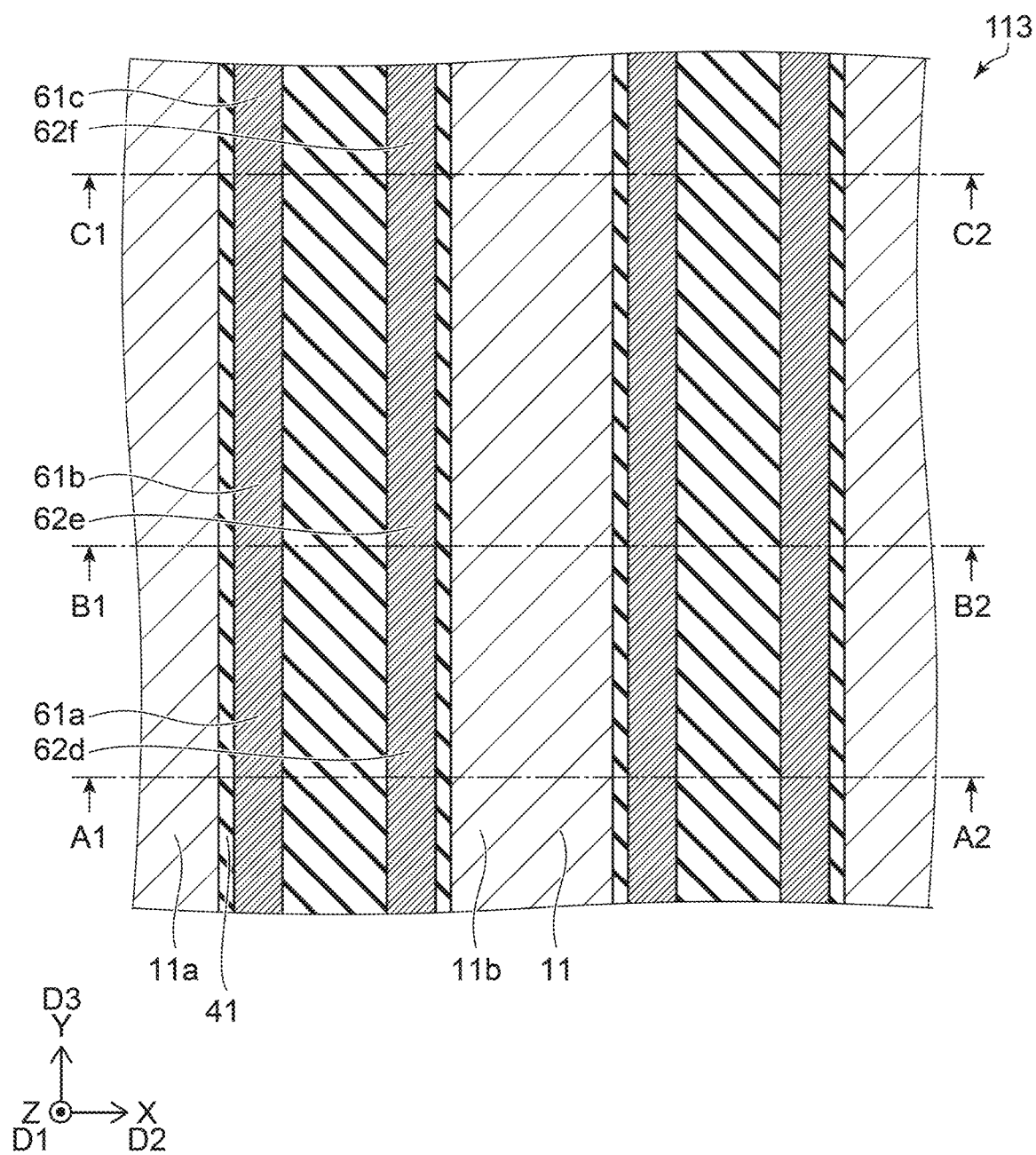
FIG. 20 is a schematic cross-sectional view illustrating the semiconductor device according to the first embodiment.

FIG. 16 is a cross-sectional view taken along line A1-A2 of FIGS. 19 and 20. FIG. 17 is a cross-sectional view taken along line B1-B2 of FIGS. 19 and 20. FIG. 18 is a cross-sectional view taken along line C1-C2 of FIGS. 19 and 20. FIG. 19 is a cross-sectional view taken along line E1-E2 of FIGS. 16 to 18. FIG. 20 is a cross-sectional view taken along line F1-F2 of FIGS. 16 to 18.

As shown in FIGS. 16 to 20, a semiconductor device 113 according to the embodiment further includes a second conductive member 62 and the second member 58b. The third electrode 53 includes the first electrode portion 53a and the second electrode portion 53b. Except for this, the configuration of the semiconductor device 113 may be the same as the configuration of the semiconductor devices 110 to 112.

In the semiconductor device 113, the second conductive member 62 includes a fourth conductive region 62d, a fifth conductive region 62e, and a sixth conductive region 62f. The boundaries of these conductive regions may be unclear. As shown in FIG. 16, the fourth conductive region 62d is between the first conductive region 61a and the second partial region 11b in the second direction D2. A position of the fourth conductive region 62d in the first direction D1 is between the position of the third partial region 11c in the first direction D1 and a position of the second electrode portion 53b in the first direction D1. As shown in FIG. 20, the fifth conductive region 62e is between the fourth conductive region 62d and the sixth conductive region 62f in the third direction D3.

As shown in FIG. 19, the second member 58b is provided between the second electrode portion 53b and the connecting member 55M in the third direction D3.

As shown in FIG. 17, a position of the fifth conductive region 62e in the first direction D1 is between the position of the third partial region 11c in the first direction D1 and a position of the second member 58b in the first direction D1.

The second member 58b includes an element different from the element included in the fifth conductive region 62e. For example, the second conductive region 61b includes the above-mentioned first element. The second member 58b includes the above-mentioned first element and the above-mentioned second element. The second portion 58b includes at least one of silicon or SiC.

A part of the insulating member 41 is provided between the second conductive member 62 and the second member 58b. For example, the insulating member 41 includes the first to fifth insulating regions 41a to 41e. The first insulating region 41a is provided between the first semiconductor portion 13a and the first electrode portion 53a, and between the third semiconductor portion 12c and the first electrode portion 53a. The second insulating region 41b is provided between the second electrode portion 53b and the second semiconductor portion 13b, and between the second electrode portion 53b and the fourth semiconductor portion 12d. The third insulating region 41c is provided between the first conductive member 61 and the first electrode portion 53a. The fourth insulating region 41d is provided between the first electrode portion 53a and the second electrode portion 53b. The fifth insulating region 41e is provided between the second conductive member 62 and the second electrode portion 53b (see FIG. 16).

The second member 58b functions as, for example, a high resistance region. Also in the semiconductor device 113, for example, the mirror period is shortened. For example, loss can be suppressed. According to the embodiment, it is possible to provide a semiconductor device capable of reducing loss.

Hereinafter, an example of the simulation result of the characteristics of the semiconductor device will be described.

FIGS. 21A to 21F are schematic cross-sectional views illustrating the semiconductor device.

These figures show a simulation model.

Figure 21A:
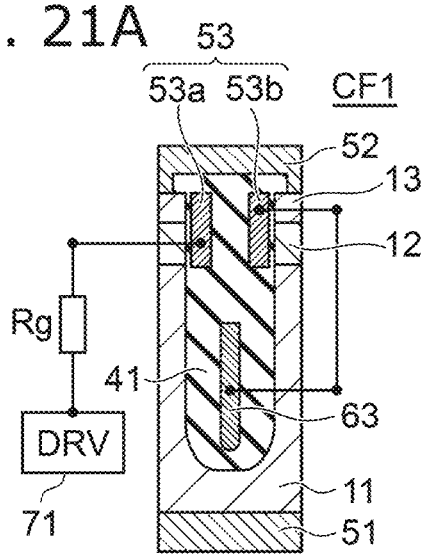
FIGS. 21A to 21F are schematic cross-sectional views illustrating the semiconductor device.

As shown in FIG. 21A, the first conductive member 61 is not provided in the first configuration CF1. A gate drive circuit 71 is electrically connected with the third electrode 53 (first electrode portion 53a and second electrode portion 53b). A resistance Rg exists between the third electrode 53 and the gate drive circuit 71. The resistance Rg is, for example, substantially a resistance of a current path between the third electrode 53 and the connecting member 55M. The third conductive member 63 is electrically connected with the second electrode 52 (or the third semiconductor region 13).

Figure 21D:
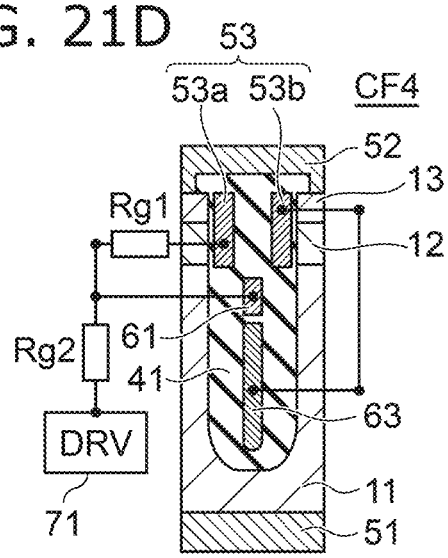
Figure 21B:
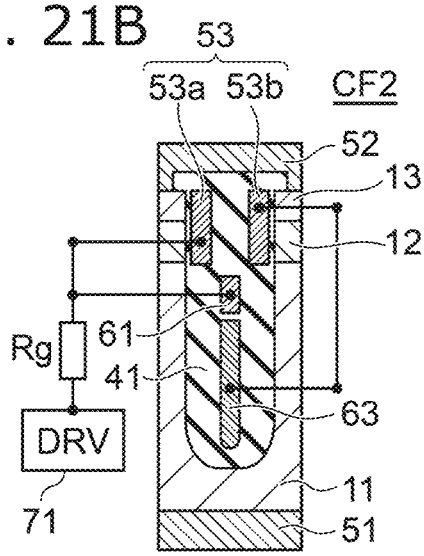

As shown in FIG. 21B, the first conductive member 61 is provided in the second configuration CF2. The first conductive member 61 is electrically connected with the gate drive circuit 71. The same resistance Rg exists in both a current path between the first conductive member 61 and the gate drive circuit 71 and a current path between the third electrode 53 and the gate drive circuit 71.

Figure 21E:
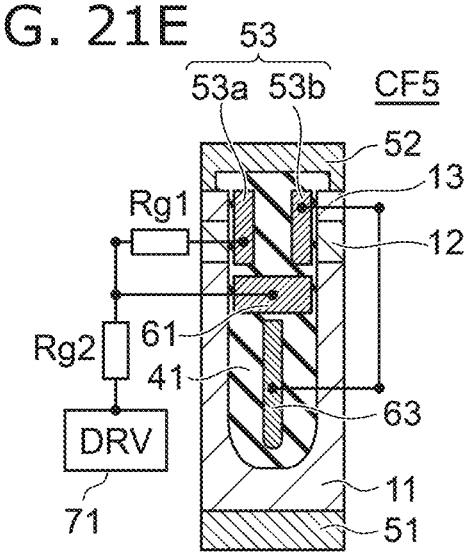
Figure 21C:
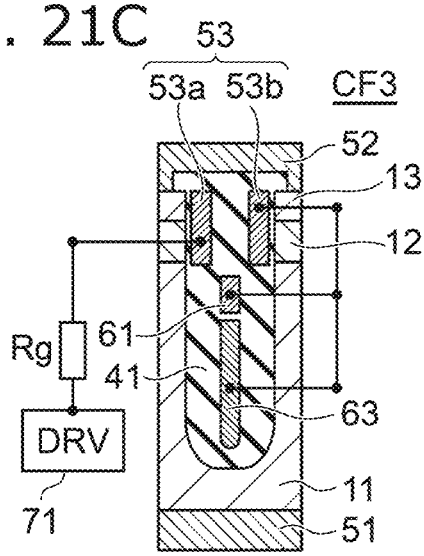

As shown in FIG. 21C, the first conductive member 61 is provided in the third configuration CF3. The first conductive member 61 is electrically connected with the second electrode 52 (or the third semiconductor region 13).

As shown in FIG. 21D, the first conductive member 61 is provided in the fourth configuration CF4. A resistance Rg2 exists in the current path between the first conductive member 61 and the gate drive circuit 71. The resistance Rg2 and resistance Rg1 exist in the current path between the third electrode 53 and the gate drive circuit 71. The resistance Rg1 corresponds to a resistance of the first member 58a and the second member 58b. The fourth configuration CF4 corresponds to, for example, the semiconductor device 111.

As shown in FIG. 21E, in the fifth configuration CF5, the resistor Rg2 exists in the current path between the first conductive member 61 and the gate drive circuit 71. The resistance Rg2 and the resistance Rg1 exist in the current path between the third electrode 53 and the gate drive circuit 71. The resistance Rg1 corresponds to the resistance of the first member 58a and the second member 58b. In the fifth configuration CF5, the first conductive member 61 overlaps the first electrode portion 53a and the second electrode portion 53b. The fifth configuration CF5 corresponds to, for example, the semiconductor device 112.

Figure 21F:
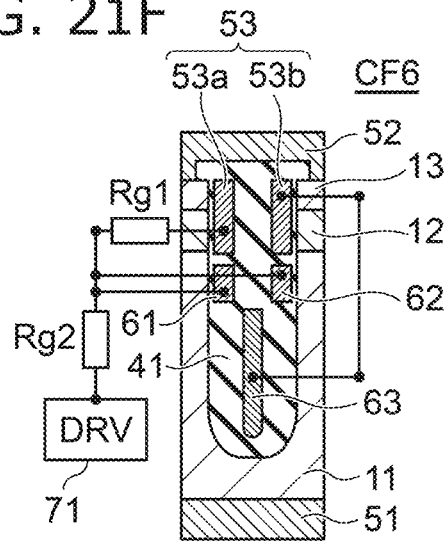

As shown in FIG. 21F, the first conductive member 61 and the second conductive member 62 are provided in the sixth configuration CF6. The resistance Rg2 exists in the current path between the first conductive member 61 and the gate drive circuit 71. The resistance Rg2 exists in a current path between the second conductive member 62 and the gate drive circuit 71. The resistance Rg2 and resistance Rg1 exist in the current path between the third electrode 53 and the gate drive circuit 71. The resistance Rg1 corresponds to the resistance of the first member 58a and the second member 58b. The sixth configuration CF6 corresponds to, for example, the semiconductor device 113.

FIGS. 22A, 22B, 23A, and 23B are graphs illustrating characteristics of the semiconductor device.

These graphs illustrate the characteristics when a surge voltage $V_{surge}$ is 20V. For example, in the first configuration CF1, the resistance Rg is 40Ω. For example, in the fifth configuration CF5, the resistance Rg1 is 50Ω and the resistance Rg2 is 1Ω.

Figure 22A:
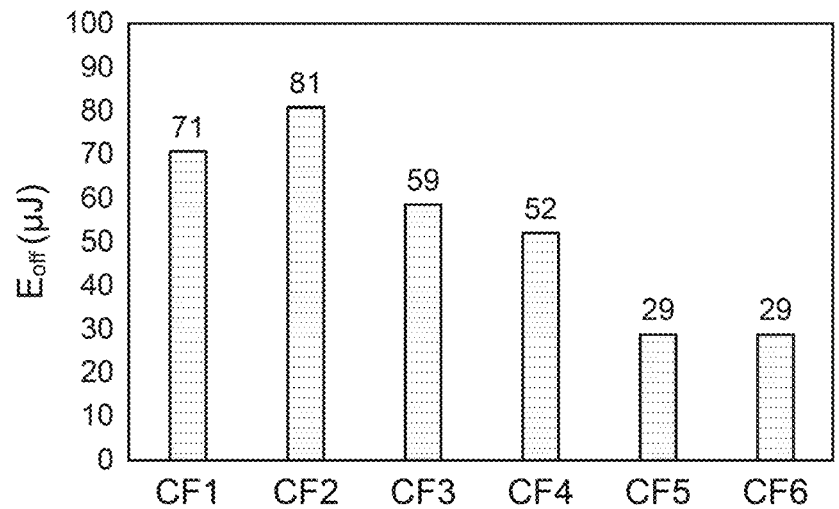
FIGS. 22A and 22B are graphs illustrating characteristics of the semiconductor device.

The vertical axis of FIG. 22A is the loss $E_{off}$ at turn-off. The loss $E_{off}$ is a value when the surge voltage $V_{surge}$ is 20 V. As shown in FIG. 22A, in the fourth to sixth configurations CF4 to CF6, a smaller loss $E_{off}$ can be obtained than in the first to third configurations CF1 to CF3.

Figure 22B:
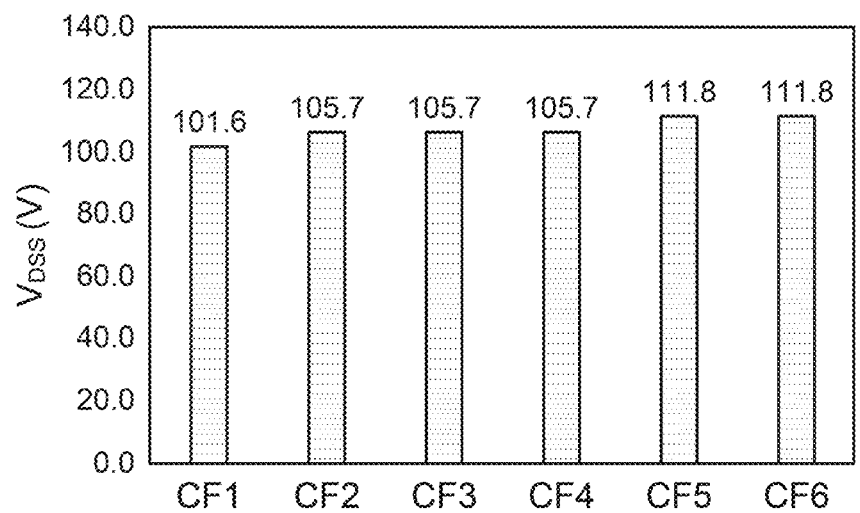

The vertical axis of FIG. 22B is a breakdown voltage $V_{DSS}$. In the fourth to sixth configurations CF4 to CF6, a high breakdown voltage $V_{DSS}$ equal to or higher than that of the first to third configurations CF1 to CF3 can be obtained.

Figure 23A:
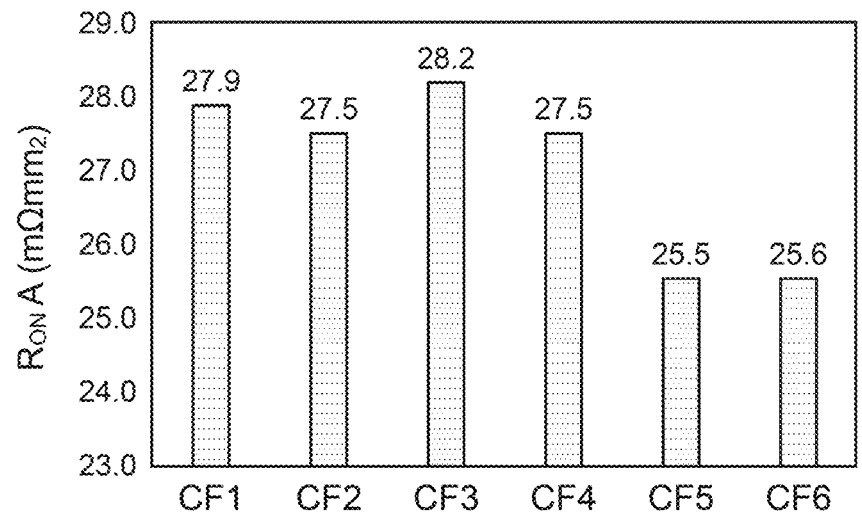
FIGS. 23A and 23B are graphs illustrating characteristics of the semiconductor device.

The vertical axis of FIG. 23A is an on-resistance RonA. In the fifth configuration CF5 and the sixth configuration CF6, an on-resistance RonA lower than that of the first to third configuration CF1 to CF3 can be obtained.

Figure 23B:
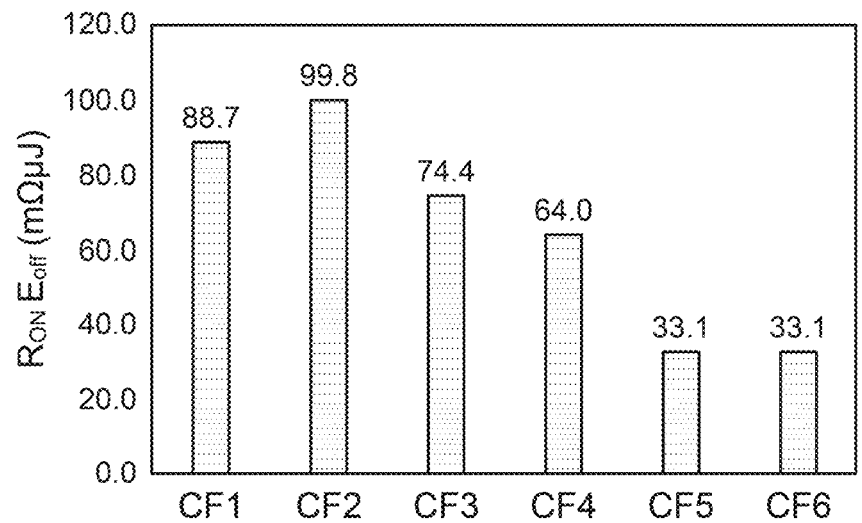

The vertical axis of FIG. 23B is a figure of merit $R_{on}E_{off}$. In the fourth to sixth configurations CF4 to CF6, a lower figure of merit $R_{on}E_{off}$ can be obtained than in the first to third configurations CF1 to CF3.

As described above, in the fourth to sixth configurations CF4 to CF6, higher characteristics can be obtained as compared with the first to third configurations CF1 to CF3. In the fourth to sixth configurations CF4 to CF6, for example, a small loss $E_{off}$ can be obtained.

Figure 24:
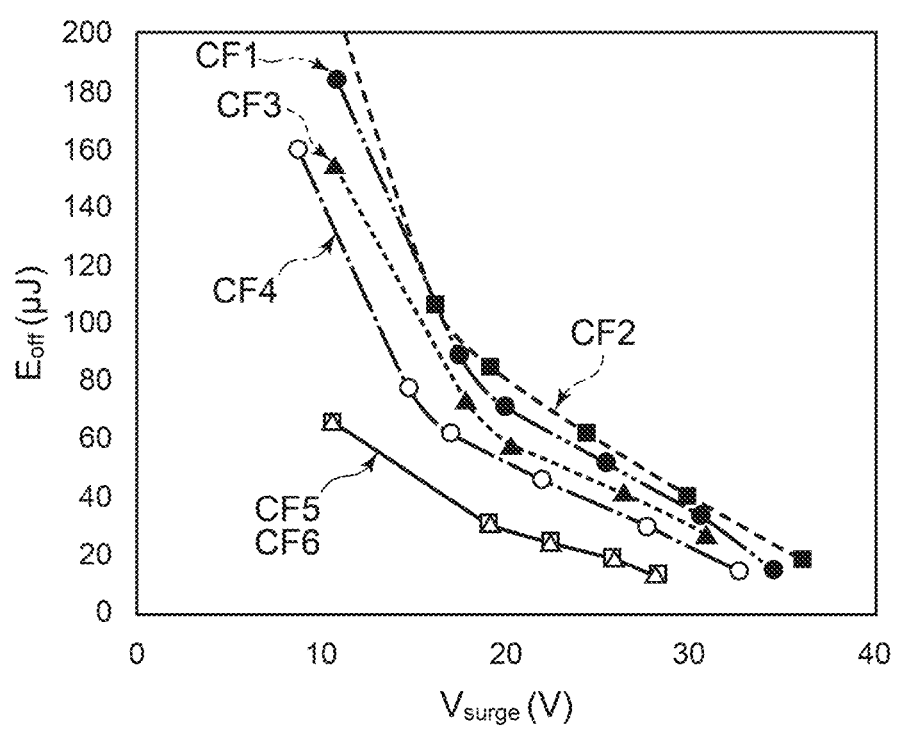
FIG. 24 is a graph illustrating characteristics of the semiconductor device.
Figure 25:
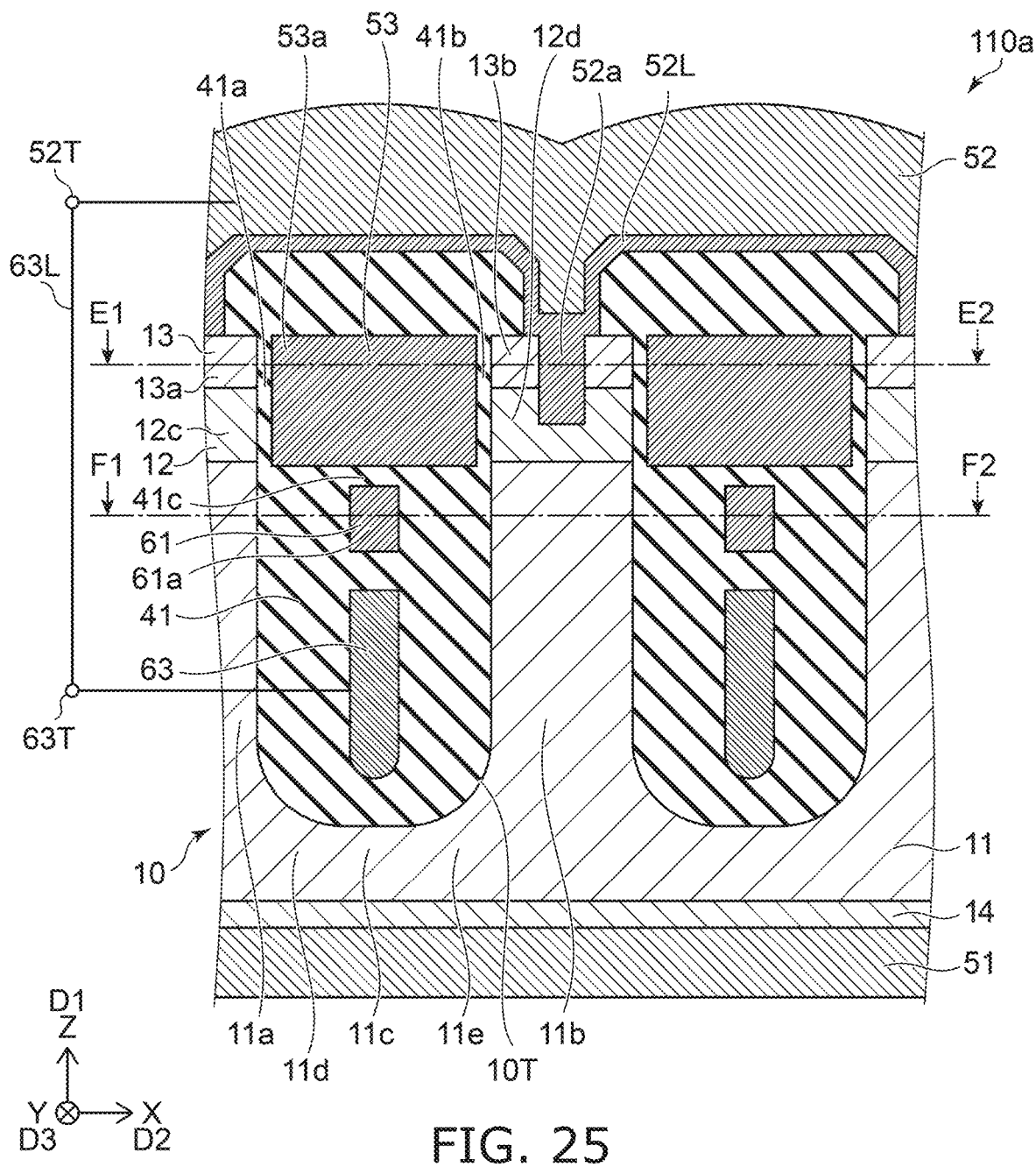
FIG. 25 is a schematic cross-sectional view illustrating a semiconductor device according to the first embodiment.
Figure 26:
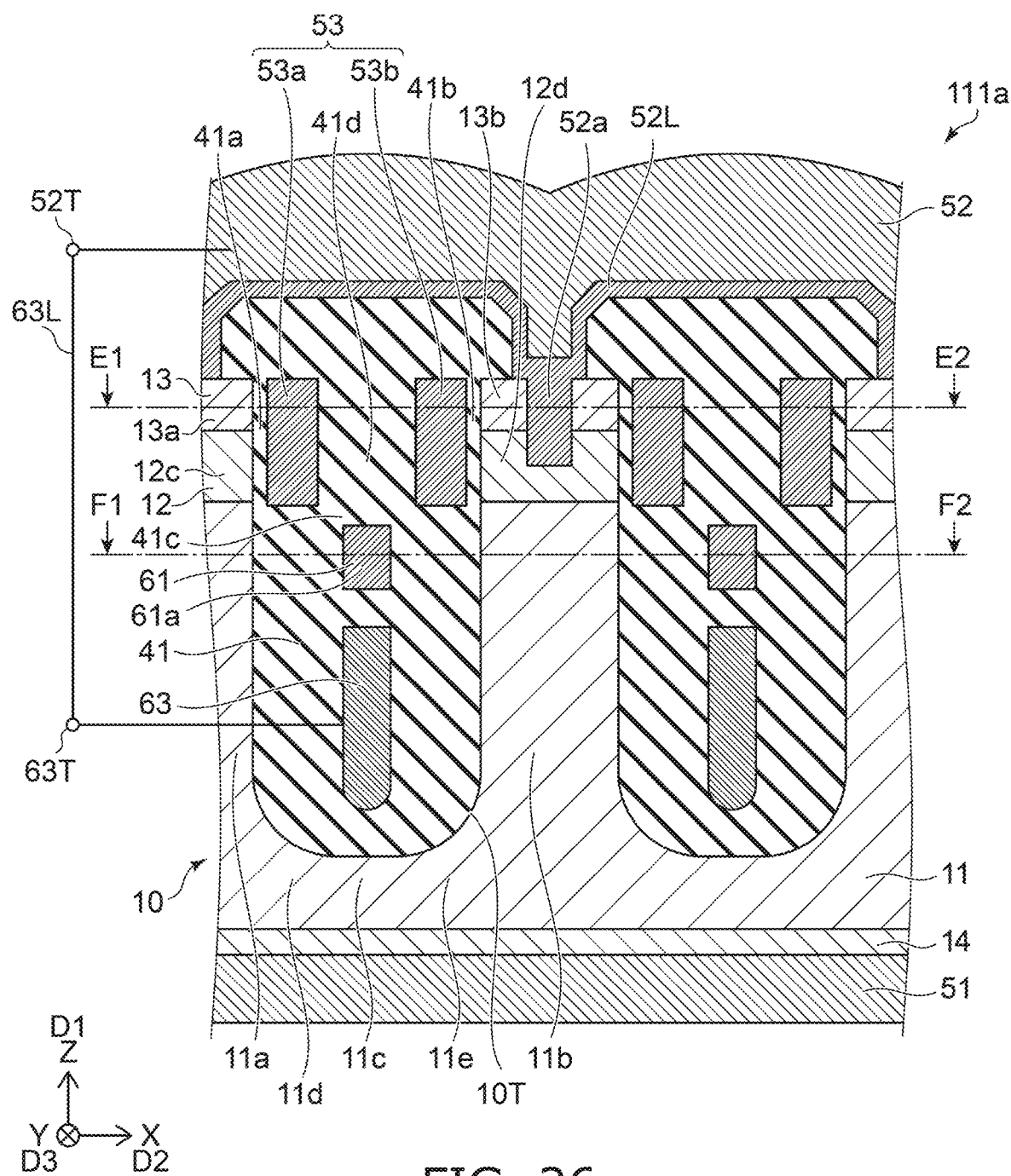
FIG. 26 is a schematic cross-sectional view illustrating a semiconductor device according to the first embodiment.
Figure 27:
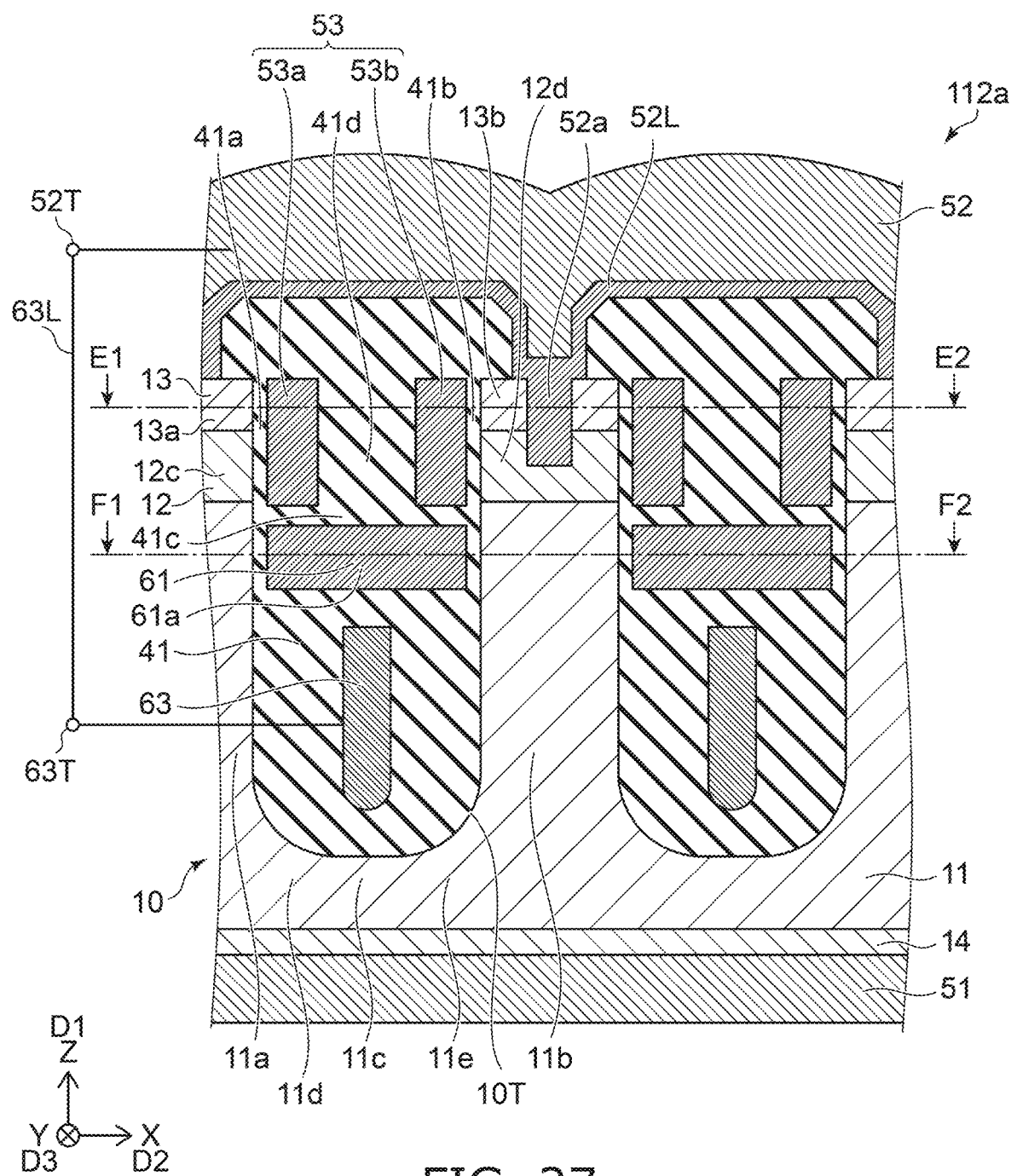
FIG. 27 is a schematic cross-sectional view illustrating a semiconductor device according to the first embodiment.
Figure 28:
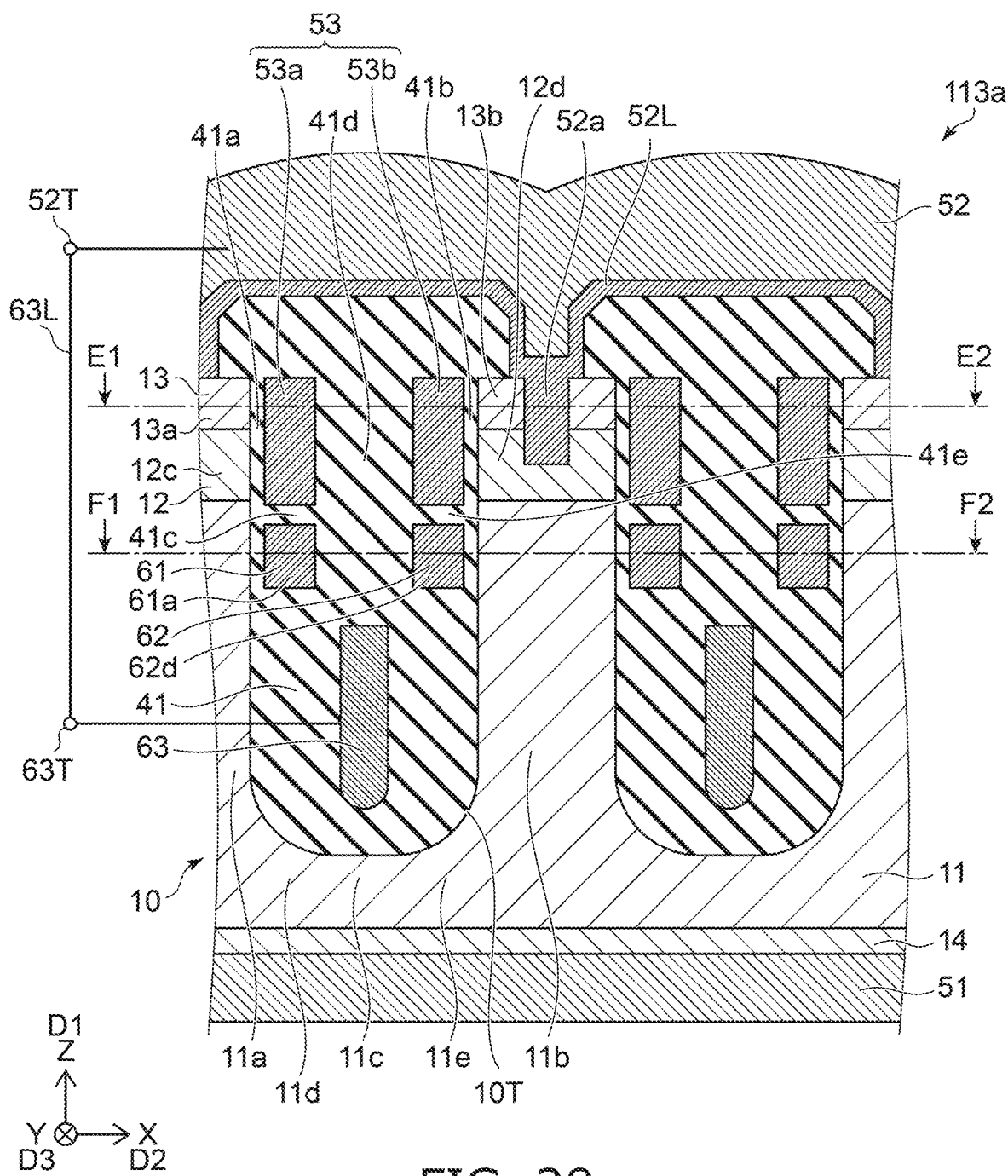
FIG. 28 is a schematic cross-sectional view illustrating a semiconductor device according to the first embodiment.

FIG. 24 is a graph illustrating the characteristics of the semiconductor device.

The horizontal axis of FIG. 24 is the surge voltage $V_{surge}$. The vertical axis is the loss $E_{off}$. As shown in FIG. 24, in the fourth to sixth configurations CF4 to CF6, the trade-off between the loss $E_{off}$ and the surge voltage $V_{surge}$ can be improved as compared with the first to third configurations CF1 to CF3.

FIGS. 25 to 28 are schematic cross-sectional views illustrating semiconductor devices according to the first embodiment.

As shown in FIGS. 25 to 28, semiconductor devices 110a to 113a according to the embodiment include a fourth semiconductor region 14. Except for this, the configurations of the semiconductor devices 110a to 113a may be the same as those of the semiconductor devices 110 to 113.

The fourth semiconductor region 14 is provided between the first electrode 51 and the first semiconductor region 11. The fourth semiconductor region 14 is of a second conductive type. The semiconductor devices 110a to 113a are, for example, IGBTs. Loss can also be reduced in the semiconductor devices 110a to 113a. For example, the trade-off between loss $E_{off}$ and surge voltage $V_{surge}$ can be improved.

Second Embodiment

The second embodiment relates to a method for manufacturing a semiconductor device. Hereinafter, an example of the method for manufacturing the semiconductor device 111 will be described.

FIGS. 29A to 29D, FIGS. 30A to 30D, and FIGS. 31A to 31D are schematic cross-sectional views illustrating the method for manufacturing the semiconductor device according to the second embodiment.

Figure 29A:
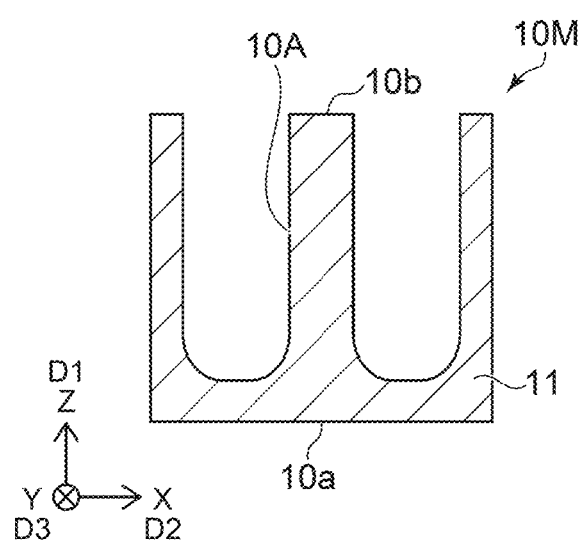
FIGS. 29A to 29D are schematic cross-sectional views illustrating a method for manufacturing a semiconductor device according to a second embodiment.

As shown in FIG. 29A, a first trench 10A is formed in the first semiconductor region 11 (first semiconductor member 10M) of the first conductive type. The first trench 10A extends along the third direction D3. As described above, the third direction D3 is, for example, the Y-axis direction. The third direction D3 crosses the plane including the first direction D1 and the second direction D2. The first direction D1 is a direction from a lower surface 10a of the first semiconductor member 10M to an upper surface 10b of the semiconductor member 10M. The second direction D2 crosses the first direction D1. The first direction D1 is, for example, the Z-axis direction. The second direction D2 is, for example, the X-axis direction.

Figure 29B:
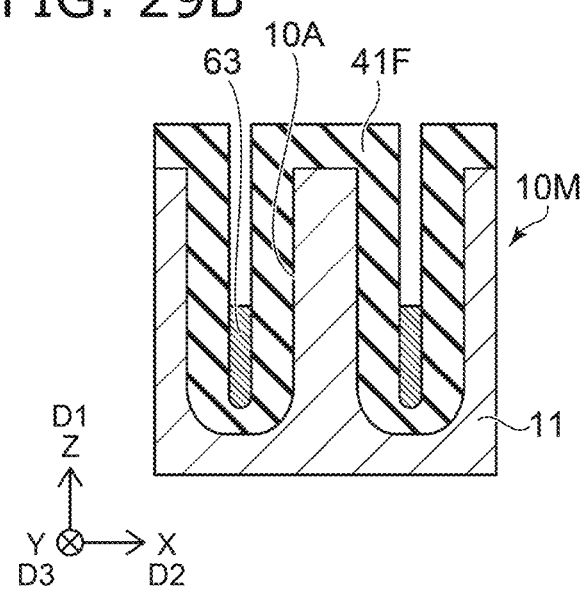

As shown in FIG. 29B, an insulating film 41F is formed inside the first trench 10A and on the first semiconductor member 10M. At least a part of the insulating film 41F becomes the insulating member 41. Further, a conductive material (for example, polysilicon including impurities) is embedded in a remaining space of the first trench 10A. As a result, the third conductive member 63 is obtained.

Figure 29C:
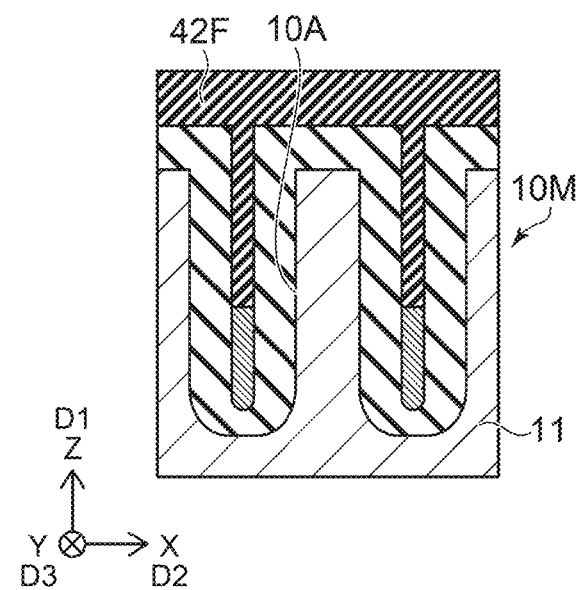

As shown in FIG. 29C, an insulating film 42F is formed on the remaining space of the first trench 10A and the insulating film 41F. The materials of the insulating film 41F and the insulating film 42F may be, for example, the same. These insulating films 41F include, for example, silicon oxide.

Figure 29D:
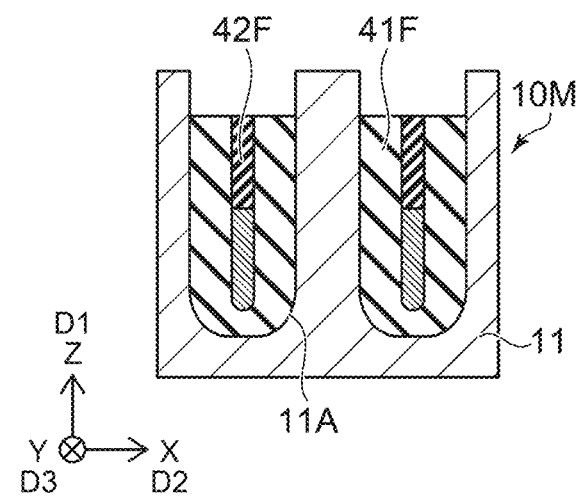

As shown in FIG. 29D, a part of the insulating film 42F is removed. As a result, the insulating film 41F and the first semiconductor member 10M are exposed.

Figure 30A:
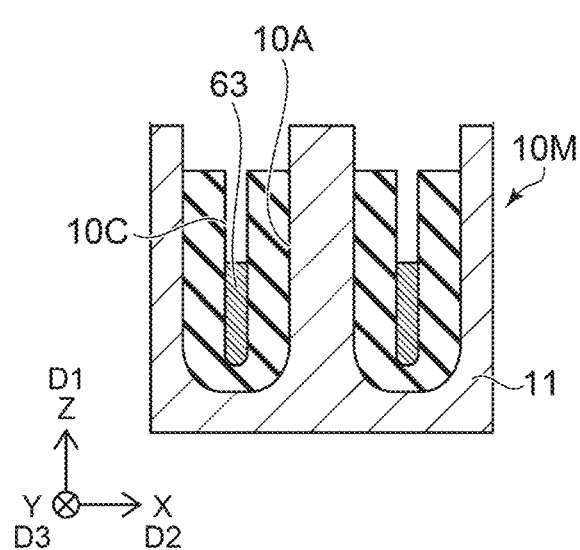
FIGS. 30A to 30D are schematic cross-sectional views illustrating the method for manufacturing the semiconductor device according to the second embodiment.

As shown in FIG. 30A, the insulating film 42F is removed. In a third trench 10C formed inside the first trench 10A, the third conductive member 63 is exposed.

Figure 30C:
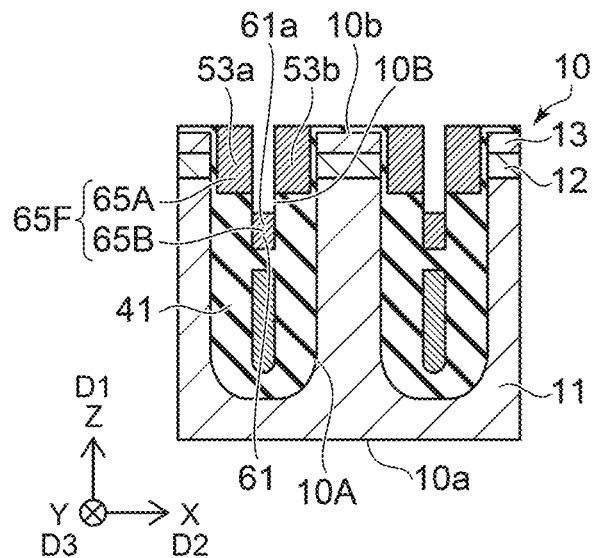
Figure 30B:
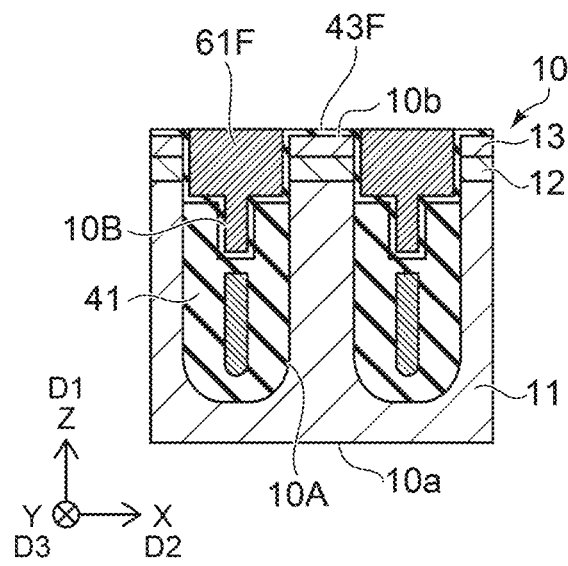

As shown in FIG. 30B, an insulating film 43F is formed inside the first trench 10A and on the first semiconductor member 10M. The insulating film 43F becomes a part of the insulating member 41 (first insulating region 41a and second insulating region 41b). A second trench 10B is formed by forming the insulating film 43F.

A conductive film 61F is formed on a remaining space of the second trench 10B and the insulating film 43F. The conductive film 61F includes, for example, at least one of silicon or SiC. The conductive film 61F includes, for example, polysilicon. The conductive film 61F includes the above-mentioned first element. The second semiconductor region 12 of the second conductive type and the third semiconductor region 13 of the first conductive type are formed. These semiconductor regions can be formed, for example, by introducing impurity ions (for example, ion implantation). As a result, the semiconductor member 10 is obtained. The second semiconductor region 12 is between the first semiconductor region 11 and the third semiconductor region 13 in the first direction D1. The lower surface 10a and the upper surface 10b of the first semiconductor member 10M correspond to the lower surface 10a and the upper surface 10b of the semiconductor member 10.

As shown in FIG. 30C, a part of the conductive film 61F is removed. As a result, the first electrode portion 53a, the second electrode portion 53b, and the first conductive region 61a are obtained.

Figure 30D:
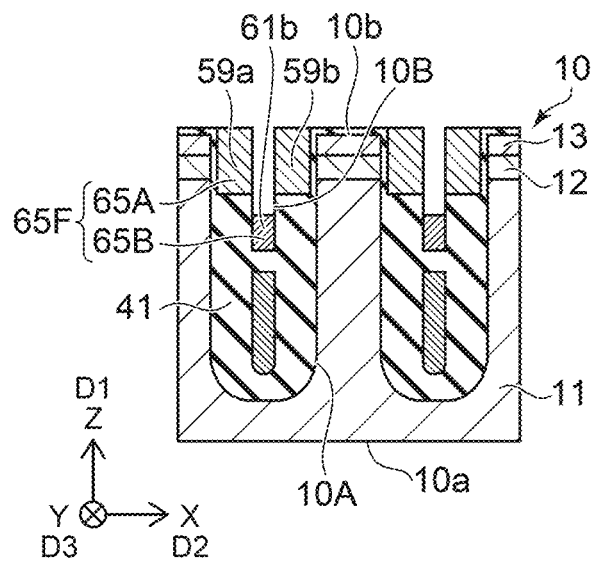

FIG. 30D illustrates a cross section different from the cross section shown in FIG. 30C in the third direction D3. By removing a part of the conductive film 61F, a conductive portion 59a, a conductive portion 59b and the second conductive region 61b are obtained. As will be described later, the conductive portion 59a and the conductive portion 59b are the first member 58a and the second member 58b.

Figure 31A:
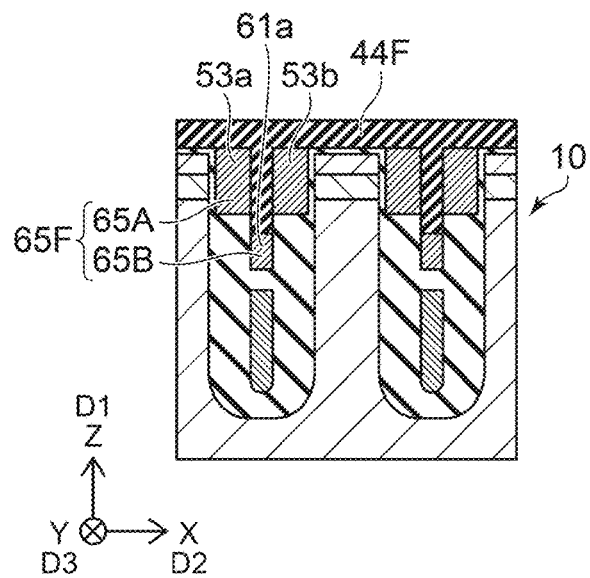
FIGS. 31A to 31D are schematic cross-sectional views illustrating the method for manufacturing the semiconductor device according to the second embodiment.
Figure 31B:
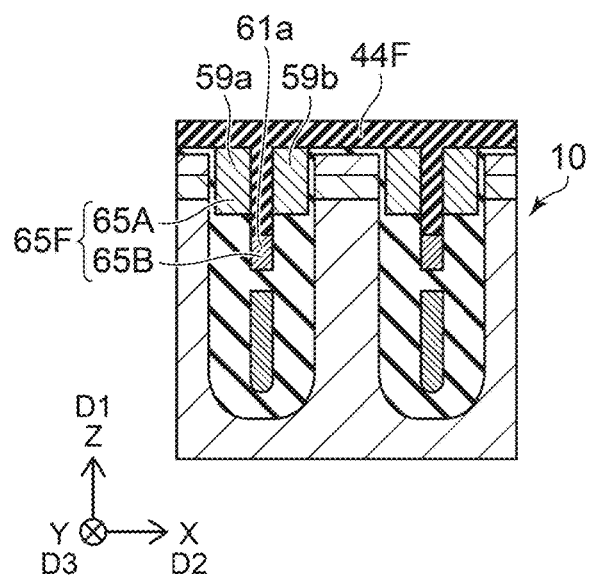

FIG. 31A is a cross-sectional view of a position corresponding to FIG. 30C. FIG. 31B is a cross-sectional view of a position corresponding to FIG. 30D. As shown in FIGS. 31A and 31B, an insulating film 44F is formed on the remaining space of the trench, the first electrode portion 53a, the second electrode portion 53b, the conductive portion 59a, and the conductive portion 59b. The insulating film 44F becomes a part of the insulating member 41.

Figure 31C:
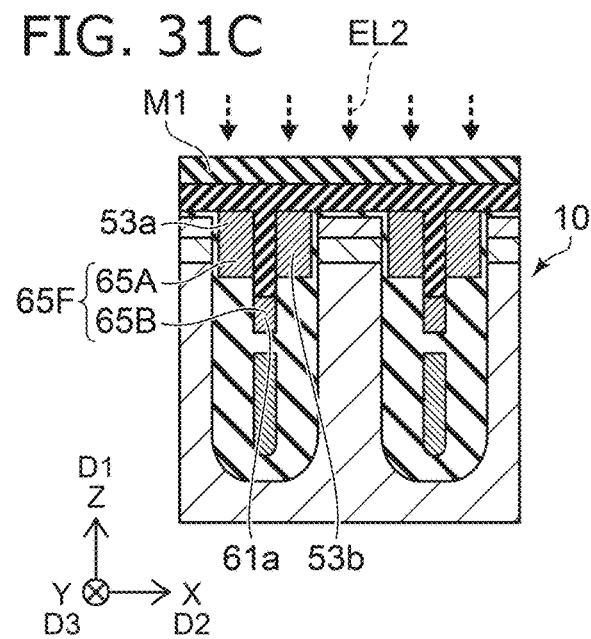
Figure 31D:
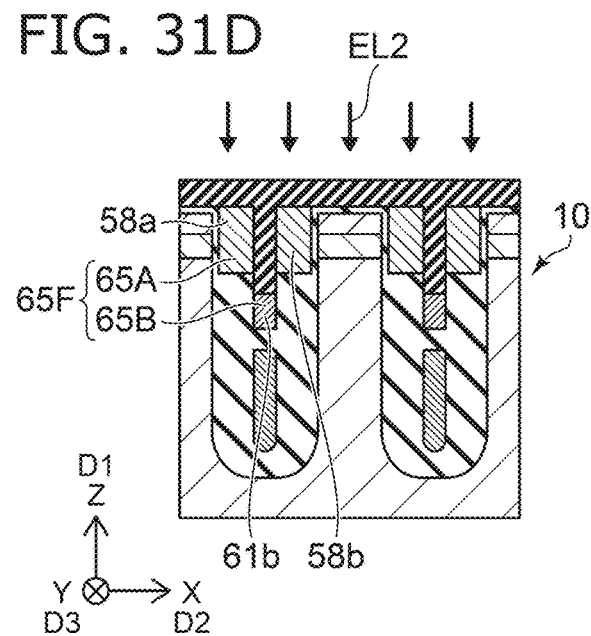

FIG. 31C is a cross-sectional view of a position corresponding to FIG. 30C. FIG. 31D is a cross-sectional view of a position corresponding to FIG. 30D. As shown in FIG. 31D, the second element EL2 is introduced into the conductive portion 59a and the conductive portion 59b. For example, the second element EL2 is ion-implanted. The introduction of the second element EL2 increases the electrical resistance of the conductive portion 59a and the conductive portion 59b. As a result, the first member 58a and the second member 58b are obtained. The second element EL2 does not substantially reach the second conductive region 61b. The second conductive region 61b does not practically include the second element EL2.

As shown in FIG. 31C, the second element EL2 is not introduced into the first electrode portion 53a and the second electrode portion 53b. For example, a mask member M1 or the like may suppress the second element EL2 from reaching the first electrode portion 53a and the second electrode portion 53b. After the step of introducing the second element EL2, the mask member M1 is removed.

After this, electrodes are appropriately formed. As a result, the semiconductor device 111 is obtained. According to the method for manufacturing the semiconductor device according to the embodiment, it is possible to provide a method for manufacturing a semiconductor device capable of reducing loss.

As described above, in the above manufacturing method, a first conductive film 65F extending along the third direction D3 is formed inside the second trench 10B provided in the insulating member 41 (see FIGS. 30C and 30D). The insulating member 41 is provided inside the first trench 10A provided in the semiconductor member 10. The third direction D3 crosses the plane containing the first direction D1 and the second direction D2. The first direction D1 is a direction from the lower surface 10a of the semiconductor member 10 to the upper surface 10b of the semiconductor member 10. The second direction D2 crosses the first direction D1 (see FIGS. 30C and 30D). For example, it includes a first conductive region 61a (first conductive portion 65A) and a conductive portion 59a (second conductive portion 65B). The semiconductor member 10 includes the first semiconductor region 11 of the first conductive type, the second semiconductor region 12 of the second conductive type, and the third semiconductor region 13 of the first conductive type. The second semiconductor region 12 is between the first semiconductor region 11 and the third semiconductor region 13 in the first direction D1. The first conductive portion 65A is between two regions of the second semiconductor region 12 and between two regions of the third semiconductor region 13 in the second direction D2. The second conductive portion 65B is between two regions of the first semiconductor region 11 in the second direction D2. The first conductive film 65F includes a semiconductor and the first element. Semiconductors include at least one of silicon or SiC. For example, semiconductors include polysilicon. The first element is of one of the first conductive type and the second conductive type.

As shown in FIG. 30C, the first conductive portion 65A includes a first conductive film region (first electrode portion 53a). As shown in FIG. 30D, the first conductive portion 65A includes a second conductive film region (conductive portion 59a). A direction from the first conductive film region (first electrode portion 53a) to the second conductive film region (conductive portion 59a) is along the third direction D3.

In the manufacturing method according to the embodiment, as shown in FIG. 31D, the other second element EL2 of the first conductive type and the second conductive type is introduced into the second conductive film region (conductive portion 59a). As shown in FIG. 31C, the introduction of the second element EL2 includes not introducing the second element EL2 into the first conductive film region (first electrode portion 53a). Thereby, the first member 58a can be selectively formed.

In the embodiment, the introduction of the second element EL2 includes not introducing the second element EL2 into the second conductive portion 65B. The first element includes one of the third element and the fourth element. The second element includes the other of the third element and the fourth element. The third element includes at least one selected from the group consisting of phosphorus, arsenic and antimony. The fourth element includes at least one selected from the group consisting of boron, aluminum and gallium.

In the above embodiment, the first electrode 51 may include, for example, at least one selected from the group consisting of aluminum, titanium, nickel, and gold. The second electrode 52 may include, for example, at least one selected from the group consisting of aluminum, titanium, nickel, and gold. The third electrode 53 may include, for example, polysilicon. The first to third conductive members 61 to 63 may include, for example, polysilicon. The first insulating member 41 may include, for example, at least one selected from the group consisting of silicon oxide, silicon nitride, and silicon oxynitride.

The embodiment may include the following configurations (e.g., technical proposals).

(Configuration 1)

A semiconductor device, comprising:
a first electrode;
a semiconductor member, the semiconductor member including a first semiconductor region of a first conductivity type, a second semiconductor region of a second conductivity type, and a third semiconductor region of the first conductivity type,
the first semiconductor region being between the first electrode and the third semiconductor region, the first semiconductor region including a first partial region, a second partial region, and a third partial region,
the second semiconductor region being between the first semiconductor region and the third semiconductor region,
the third semiconductor region including a first semiconductor portion and a second semiconductor portion, a second direction from the first semiconductor portion to the second semiconductor portion crossing a first direction from the first electrode to the third semiconductor region,
the second semiconductor region including a third semiconductor portion and a fourth semiconductor portion, a direction from the third semiconductor portion to the fourth semiconductor portion being along the second direction,
the third semiconductor portion being between the first partial region and the first semiconductor portion in the first direction,
the fourth semiconductor portion being between the second partial region and the second semiconductor portion in the first direction,
a position of the third partial region in the second direction being between a position of the first partial region in the second direction and a position of the second partial region in the second direction;
a second electrode electrically connected with the third semiconductor region;
a third electrode including a first electrode portion, the first electrode portion being between the first semiconductor portion and the second semiconductor portion, and between the third semiconductor portion and the fourth semiconductor portion in the second direction;
a first conductive member including a first conductive region, a second conductive region, and a third conductive region, the first conductive region being between the first partial region and the second partial region in the second direction, a position of the first conductive region in the first direction being between a position of the third partial region in the first direction and a position of the first electrode portion in the first direction, the second conductive region being between the first conductive region and the third conductive region in a third direction crossing a plane including the first direction and the second direction;
a connecting member electrically connected with the first conductive member, a direction from the third conductive region to the connecting member being along the first direction;
a first member provided between the first electrode portion and the connecting member in the third direction, a position of the second conductive region in the first direction being between a position of the third partial region in the first direction and a position of the first member in the first direction, the first member including an element different from an element included in the second conductive region; and
an insulating member provided between the semiconductor member and the third electrode, between the semiconductor member and the first conductive member, and between the first conductive member and the first member.

(Configuration 2)

The semiconductor device according to Configuration 1, wherein
the second conductive region includes a first element,
the first member includes the first element and a second element,
the first element includes one of a third element and a fourth element,
the second element includes other one of the third element and the fourth element,
the third element includes at least one selected from the group consisting of phosphorus, arsenic and antimony, and
the fourth element includes at least one selected from the group consisting of boron, aluminum and gallium.

(Configuration 3)

The semiconductor device according to Configuration 1, wherein
the second conductive region includes phosphorus, and
the first member includes phosphorus and boron.

(Configuration 4)

The semiconductor device according to Configuration 2 or 3, wherein
the second conductive region and the first member include silicon.

(Configuration 5)

The semiconductor device according to any one of Configurations 1 to 4, wherein
conductivity of the second conductive region is higher than conductivity of the first member.

(Configuration 6)

The semiconductor device according to any one of Configurations 1 to 5, wherein
the insulating member includes
a first insulating region provided between the first semiconductor portion and the first electrode portion, and between the third semiconductor portion and the first electrode portion,
a second insulating region provided between the first electrode portion and the second semiconductor portion, and between the first electrode portion and the fourth semiconductor portion, and
a third insulating region provided between the first conductive member and the first electrode portion.

(Configuration 7)

The semiconductor device according to any one of Configurations 1 to 5, wherein
the third electrode further include a second electrode portion,
the second electrode portion is between the first electrode portion and the second semiconductor portion, and between the first electrode portion and the fourth semiconductor portion in the second direction, and
a part of the insulating member is between the first electrode portion and the second electrode portion.

(Configuration 8)

The semiconductor device according to Configuration 7, further comprising:
a second member,
the second member being provided between the second electrode portion and the connecting member in the third direction,
the second member including an element different from the element included in the second conductive region, and
a part of the insulating member being provided between the second conductive region and the second member.

(Configuration 9)

The semiconductor device according to Configuration 7 or 8, wherein
the insulating member includes
a first insulating region provided between the first semiconductor portion and the first electrode portion, and between the third semiconductor portion and the first electrode portion,
a second insulating region provided between the second electrode portion and the second semiconductor portion, and between the second electrode portion and the fourth semiconductor portion,
a third insulating region provided between the first conductive member and the first electrode portion, and between the first conductive member and the second electrode portion, and
a fourth insulating region provided between the first electrode portion and the second electrode portion.

(Configuration 10)

The semiconductor device according to any one of Configurations 7 to 9, wherein
a position of the first conductive region in the second direction is between a position of the first electrode portion in the second direction and a position of the second electrode portion in the second direction.

(Configuration 11)

The semiconductor device according to any one of Configurations 7 to 9, wherein
a part of the first conductive region overlaps a part of the insulating member in the first direction, and
an other part of the first conductive region overlaps the first electrode portion and the second electrode portion in the first direction.

(Configuration 12)

The semiconductor device according to Configuration 7, further comprising:
a second conductive member; and
a second member,
the second conductive member including a fourth conductive region, a fifth conductive region, and a sixth conductive region,
the fourth conductive region being between the first conductive region and the second partial region in the second direction, a position of the fourth conductive region in the first direction being between a position of the third partial region in the first direction and a position of the second electrode portion in the first direction, the fifth conductive region being between the fourth conductive region and the sixth conductive region in the third direction,
the second member being provided between the second electrode portion and the connecting member in the third direction,
a position of the fifth conductive region in the first direction being between a positon of the third partial region in the first direction and a position of the second member in the first direction,
the second member including an element different from an element included in the fifth conductive region, and
a part of the insulating member being provided between the second conductive member and the second member.

(Configuration 13)

The semiconductor device according to Configuration 12, wherein
the insulating member includes
a first insulating region provided between the first semiconductor portion and the first electrode portion, and between the third semiconductor portion and the first electrode portion,
a second insulating region provided between the second electrode portion and the second semiconductor portion, and between the second electrode portion and the fourth semiconductor portion,
a third insulating region provided between the first conductive member and the first electrode portion,
a fourth insulating region provided between the first electrode portion and the second electrode portion, and
a fifth insulating region provided between the second conductive member and the second electrode portion.

(Configuration 14)

The semiconductor device according to any one of Configurations 1 to 13, further comprising:
a third conductive member,
a position of the third conductive member in the first direction being between a position of the third partial region in the first direction and a position of the first conductive member in the first direction, and
the third conductive member being electrically connected with the second electrode, or the third conductive member being configured to be electrically connected with the second electrode.

(Configuration 15)

The semiconductor device according to any one of Configurations 1 to 14, wherein
the second conductive region does not include the second element, or
a concentration of the second element in the second conductive region is not more than $\frac{1}{10}$ of a concentration of the second element in the first member.

(Configuration 16)

The semiconductor device according to any one of Configurations 1 to 15, wherein
the first electrode portion does not include the second element, or
a concentration of the second element in the first electrode portion is not more than $\frac{1}{10}$ of a concentration of the second element in the first member.

(Configuration 17)

The semiconductor device according to any one of Configurations 1 to 16, wherein
the first member electrically connects the first electrode portion with the connecting member.

(Configuration 18)

A method for manufacturing a semiconductor device, comprising:
forming a first conductive film extending along a third direction inside a second trench provided in an insulating member, the insulating member being provided inside a first trench provided in a semiconductor member, the third direction crossing a plane including a first direction and a second direction, the first direction being a direction from a lower surface of the semiconductor member to an upper surface of the semiconductor member, the second direction crossing the first direction, the first conductive film including a first conductive portion and a second conductive portion, the semiconductor member including a first semiconductor region of a first conductivity type, a second semiconductor region of a second conductivity type, and a third semiconductor region of the first conductivity type, the second semiconductor region being between the first semiconductor region and the third semiconductor region in the first direction, the first conductive portion being between two regions of the second semiconductor region and between two regions of the third semiconductor region in the second direction, the second conductive portion being between two regions of the first semiconductor region in the second direction, the first conductive film including a semiconductor a first element of one of the first conductivity type and the second conductivity type, the first conductive portion including a first conductive film region and a second conductive film region, a direction from the first conductive film region to the second conductive film region being along the third direction; and
introducing a second element of other one of the first conductivity type and the second conductivity type into the second conductive film region, the introducing the second element including not introducing the second element into the first conductive film region.

(Configuration 19)

The method for manufacturing the semiconductor device according to Configuration 18, wherein
the introducing the second element includes not introducing the second element into the second conductive portion.

(Configuration 20)

The method for manufacturing the semiconductor device according to Configuration 19, wherein
the first element includes one of a third element and a fourth element,
the second element includes other one of the third element and the fourth element,
the third element includes at least one selected from the group of consisting of phosphorus, arsenic, and antimony, and
the fourth element includes at least one selected from the group consisting of boron, aluminum, and gallium.

According to the embodiment, it is possible to provide a semiconductor device and a method for manufacturing the same in which loss can be reduced.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, conductive members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a semiconductor member, the semiconductor member including a first semiconductor region of a first conductivity type, a second semiconductor region of a second conductivity type, and a third semiconductor region of the first conductivity type,
the first semiconductor region being between the first electrode and the third semiconductor region, the first semiconductor region including a first partial region, a second partial region, and a third partial region,
the second semiconductor region being between the first semiconductor region and the third semiconductor region,
the third semiconductor region including a first semiconductor portion and a second semiconductor portion, a second direction from the first semiconductor portion to the second semiconductor portion crossing a first direction from the first electrode to the third semiconductor region,
the second semiconductor region including a third semiconductor portion and a fourth semiconductor portion, a direction from the third semiconductor portion to the fourth semiconductor portion being along the second direction,
the third semiconductor portion being between the first partial region and the first semiconductor portion in the first direction,
the fourth semiconductor portion being between the second partial region and the second semiconductor portion in the first direction, a position of the third partial region in the second direction being between a position of the first partial region in the second direction and a position of the second partial region in the second direction;

a second electrode electrically connected with the third semiconductor region;

a third electrode including a first electrode portion, the first electrode portion being between the first semiconductor portion and the second semiconductor portion, and between the third semiconductor portion and the fourth semiconductor portion in the second direction;

a first conductive member including a first conductive region, a second conductive region, and a third conductive region, the first conductive region being between the first partial region and the second partial region in the second direction, a position of the first conductive region in the first direction being between a position of the third partial region in the first direction and a position of the first electrode portion in the first direction, the second conductive region being between the first conductive region and the third conductive region in a third direction crossing a plane including the first direction and the second direction;

a connecting member electrically connected with the first conductive member, a direction from the third conductive region to the connecting member being along the first direction;

a first member provided between the first electrode portion and the connecting member in the third direction, a position of the second conductive region in the first direction being between a position of the third partial region in the first direction and a position of the first member in the first direction, the first member including an element different from an element included in the second conductive region; and an insulating member provided between the semiconductor member and the third electrode, between the semiconductor member and the first conductive member, and between the first conductive member and the first member.

2. The device according to claim 1, wherein
the second conductive region includes a first element,
the first member includes the first element and a second element,
the first element includes one of a third element and a fourth element,
the second element includes other one of the third element and the fourth element,
the third element includes at least one selected from the group consisting of phosphorus, arsenic and antimony, and
the fourth element includes at least one selected from the group consisting of boron, aluminum and gallium.

3. The device according to claim 2, wherein
the second conductive region and the first member include silicon.

4. The device according to claim 1, wherein
the second conductive region includes phosphorus, and
the first member includes phosphorus and boron.

5. The device according to claim 1, wherein
conductivity of the second conductive region is higher than conductivity of the first member.

6. The device according to claim 1, wherein
the insulating member includes
a first insulating region provided between the first semiconductor portion and the first electrode portion, and between the third semiconductor portion and the first electrode portion,
a second insulating region provided between the first electrode portion and the second semiconductor portion, and between the first electrode portion and the fourth semiconductor portion, and
a third insulating region provided between the first conductive member and the first electrode portion.

7. The device according to claim 1, wherein
the third electrode further include a second electrode portion,
the second electrode portion is between the first electrode portion and the second semiconductor portion, and between the first electrode portion and the fourth semiconductor portion in the second direction, and
a part of the insulating member is between the first electrode portion and the second electrode portion.

8. The device according to claim 7, further comprising:
a second member,
the second member being provided between the second electrode portion and the connecting member in the third direction,
the second member including an element different from the element included in the second conductive region, and
a part of the insulating member being provided between the second conductive region and the second member.

9. The device according to claim 7, wherein
the insulating member includes
a first insulating region provided between the first semiconductor portion and the first electrode portion, and between the third semiconductor portion and the first electrode portion,
a second insulating region provided between the second electrode portion and the second semiconductor portion, and between the second electrode portion and the fourth semiconductor portion,
a third insulating region provided between the first conductive member and the first electrode portion, and between the first conductive member and the second electrode portion, and
a fourth insulating region provided between the first electrode portion and the second electrode portion.

10. The device according to claim 7, wherein
a position of the first conductive region in the second direction is between a position of the first electrode portion in the second direction and a position of the second electrode portion in the second direction.

11. The device according to claim 7, wherein
a part of the first conductive region overlaps a part of the insulating member in the first direction, and
an other part of the first conductive region overlaps the first electrode portion and the second electrode portion in the first direction.

12. The device according to claim 7, further comprising:
a second conductive member; and
a second member,
the second conductive member including a fourth conductive region, a fifth conductive region, and a sixth conductive region,
the fourth conductive region being between the first conductive region and the second partial region in the second direction, a position of the fourth conductive region in the first direction being between a position of the third partial region in the first direction and a position of the second electrode portion in the first direction, the fifth conductive region being between the fourth conductive region and the sixth conductive region in the third direction, the second member being provided between the second electrode portion and the connecting member in the third direction, a position of the fifth conductive region in the first direction being between a positon of the third partial region in the first direction and a position of the second member in the first direction, the second member including an element different from an element included in the fifth conductive region, and a part of the insulating member being provided between the second conductive member and the second member.

13. The device according to claim 12, wherein the insulating member includes
- a first insulating region provided between the first semiconductor portion and the first electrode portion, and between the third semiconductor portion and the first electrode portion,
- a second insulating region provided between the second electrode portion and the second semiconductor portion, and between the second electrode portion and the fourth semiconductor portion,
- a third insulating region provided between the first conductive member and the first electrode portion,
- a fourth insulating region provided between the first electrode portion and the second electrode portion, and
- a fifth insulating region provided between the second conductive member and the second electrode portion.

14. The device according to claim 1, further comprising:
a third conductive member,
a position of the third conductive member in the first direction being between a position of the third partial region in the first direction and a position of the first conductive member in the first direction, and
the third conductive member being electrically connected with the second electrode, or the third conductive member being configured to be electrically connected with the second electrode.

15. The device according to claim 1, wherein
the second conductive region does not include the second element, or
a concentration of the second element in the second conductive region is not more than $1/10$ of a concentration of the second element in the first member.

16. The device according to claim 1, wherein
the first electrode portion does not include the second element, or
a concentration of the second element in the first electrode portion is not more than $1/10$ of a concentration of the second element in the first member.

17. The device according to claim 1, wherein
the first member electrically connects the first electrode portion with the connecting member.

* * * * *